United States Patent [19]
Okamoto

[11] Patent Number: 6,106,981
[45] Date of Patent: *Aug. 22, 2000

[54] MASK FOR MANUFACTURING SEMICONDUCTOR DEVICE AND METHOD OF MANUFACTURE THEREOF

[75] Inventor: Yoshihiko Okamoto, Kodaira, Japan

[73] Assignee: Hitachi, Ltd., Tokyo, Japan

[ * ] Notice: This patent is subject to a terminal disclaimer.

[21] Appl. No.: 09/287,561

[22] Filed: Apr. 6, 1999

Related U.S. Application Data

[63] Continuation of application No. 09/099,332, Jun. 18, 1998, Pat. No. 5,948,574, which is a continuation of application No. 08/829,233, Mar. 31, 1997, Pat. No. 5,830,606, which is a continuation of application No. 08/631,000, Apr. 12, 1996, Pat. No. 5,643,698, which is a continuation of application No. 08/449,926, May 25, 1995, Pat. No. 5,631,108, which is a division of application No. 08/288,905, Jun. 11, 1994, Pat. No. 5,484,671, which is a division of application No. 08/087,074, Jul. 7, 1993, Pat. No. 5,358,807, which is a continuation of application No. 07/730,221, Jul. 15, 1991, abandoned, which is a continuation of application No. 07/437,268, Nov. 16, 1989, Pat. No. 5,045,417.

[30] Foreign Application Priority Data

Nov. 22, 1988 [JP] Japan .................................. 63-295350

[51] Int. Cl.⁷ ........................................................ G03F 9/00
[52] U.S. Cl. ................................................................ 430/5
[58] Field of Search .................................................... 430/5

[56] References Cited

U.S. PATENT DOCUMENTS

| | | |
|---|---|---|
| 3,842,202 | 10/1974 | Coale . |
| 4,037,918 | 7/1977 | Kato . |
| 4,195,909 | 4/1980 | Holle et al. . |
| 4,360,586 | 11/1982 | Flanders et al. . |
| 4,779,001 | 10/1988 | Makosch . |
| 4,809,341 | 2/1989 | Matsui et al. . |
| 4,814,244 | 3/1989 | Kuguchi et al. . |
| 4,883,359 | 11/1989 | Ina et al. . |
| 4,890,309 | 12/1989 | Smith et al. . |
| 4,902,899 | 2/1990 | Lin et al. . |
| 4,925,755 | 5/1990 | Yamaguchi et al. . |
| 5,045,417 | 9/1991 | Okamoto . |
| 5,045,419 | 9/1991 | Okumura . |
| 5,306,585 | 4/1994 | Okamoto . |

FOREIGN PATENT DOCUMENTS

| | | |
|---|---|---|
| 0090924 | 10/1983 | European Pat. Off. . |
| 535572 | 7/1976 | Japan . |

(List continued on next page.)

OTHER PUBLICATIONS

J. Vac. Sci. Technol. B6 (1), vol. 6, No. 1, Jan./Feb. 1988, pp. 150–153.

J. Vac. Sci. Technol. 16(6), vol. 16, No. 6, Nov./Dec. 1979, pp. 1949–1952.

Ito, et al "Photo–projection Image Distortion Corrections for lu For lu Pattern Process", May 1985, vol. J68, No. 5 (1985), pp. 225–332.

SPIE vol. 470 "Optical Microlithography III . . . ", (1984), pp. 228–232, Prouty, et al. Spatial period division—A new technie for exposing submicrometer–lindwidth periodic and quasiperiodic patterns, Flanders, et al, J. Vac. Sci. Technol, 16(6), Nov./Dec. 1979, pp. 1949–1952.

*Primary Examiner*—Mark Chapman
*Attorney, Agent, or Firm*—Antonelli, Terry, Stout & Kraus, LLP

[57] ABSTRACT

The present invention relates to a microminiaturization technique to achieve the miniaturization and higher integration of IC chip and to the improvement of a mask used in its manufacturing process. In other words, the phases of lights transmitted through the mask is controlled within one mask pattern. Specifically, a transparent film is formed in such a manner that it covers a mask pattern along a pattern formed by magnifying or demagnifying the mask pattern or otherwise a groove is formed in a mask substrate. A phase difference of 180° is generated between the lights transmitted through the mask substrate and the transparent film or the groove, causing interference with each light to offset each other. Therefore, the pattern transferred onto a wafer has an improved resolution, being used in the invention.

15 Claims, 19 Drawing Sheets

FOREIGN PATENT DOCUMENTS

| | | |
|---|---|---|
| 576849 | 6/1980 | Japan . |
| 5754939 | 9/1980 | Japan . |
| 150225 | 11/1980 | Japan . |
| 168655 | 12/1981 | Japan . |
| 57-62052 | 4/1982 | Japan . |
| 173744 | 10/1983 | Japan . |
| 129423 | 7/1984 | Japan . |
| 59-168449 | 9/1984 | Japan . |
| 208830 | 11/1984 | Japan . |
| 98625 | 6/1985 | Japan . |
| 62-189468 | 2/1986 | Japan . |
| 113234 | 5/1986 | Japan . |
| 61-290306 | 12/1986 | Japan . |
| 61-292643 | 12/1986 | Japan . |
| 67514 | 3/1987 | Japan . |
| 62-67547 | 3/1987 | Japan . |
| 62-92438 | 4/1987 | Japan . |
| 237454 | 10/1987 | Japan . |
| 62-261004 | 11/1987 | Japan . |
| 1283925 | 5/1988 | Japan . |
| 63-151019 | 6/1988 | Japan . |
| 63-165851 | 7/1988 | Japan . |
| 63-216052 | 9/1988 | Japan . |
| 63-295350 | 11/1988 | Japan . |
| 147458 | 6/1989 | Japan . |
| 1257226 | 10/1989 | Japan . |
| 197708 | 8/1977 | U.S.S.R. . |
| 570005 | 8/1977 | U.S.S.R. . |
| 1151904 | 4/1985 | U.S.S.R. . |

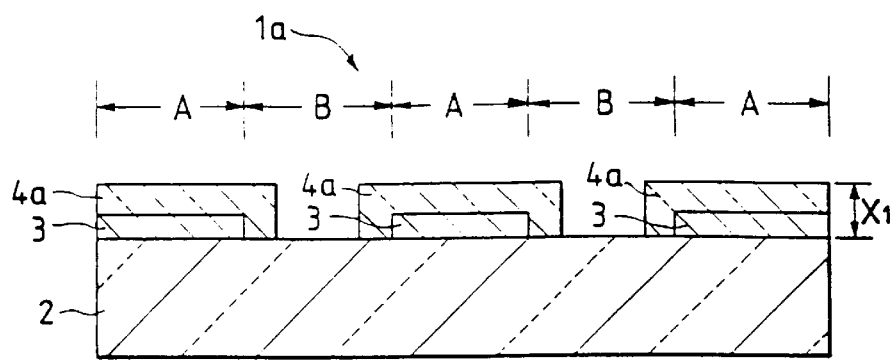
FIG. 1
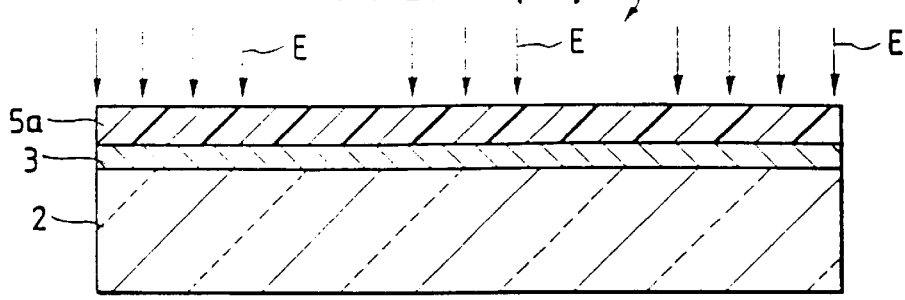
FIG. 2(a)
FIG. 2(b)
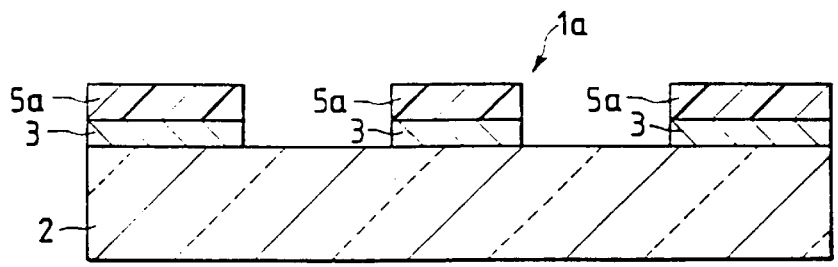
FIG. 2(c)
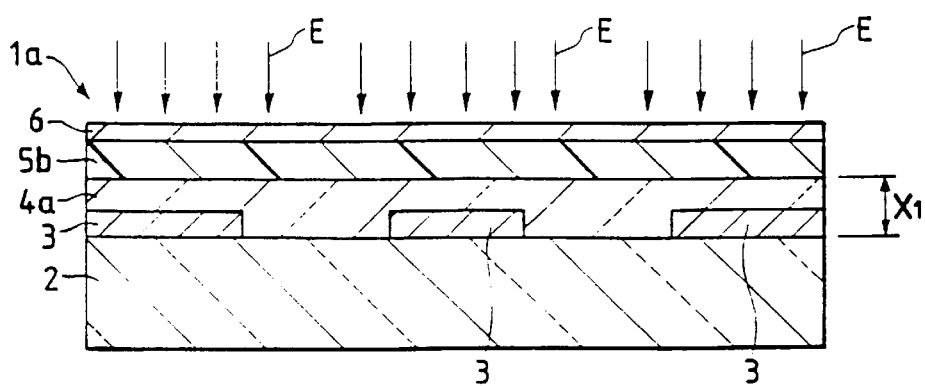

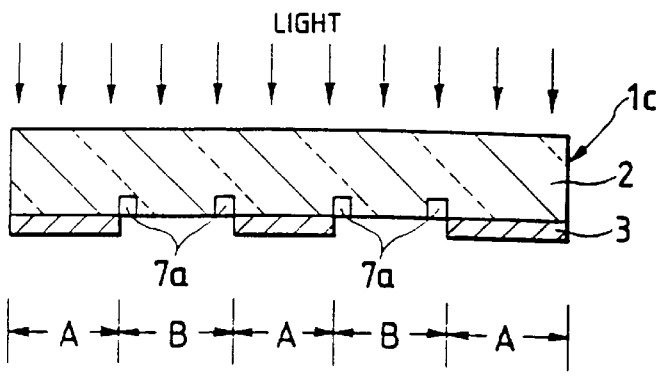
FIG. 11(a)
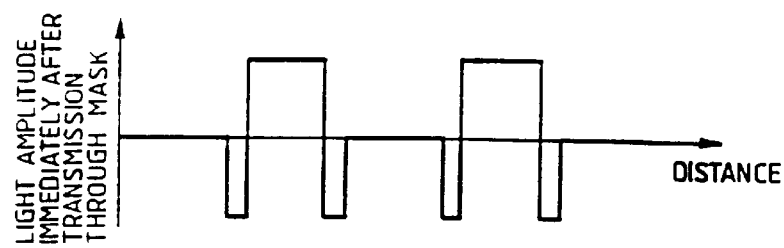
FIG. 11(b)
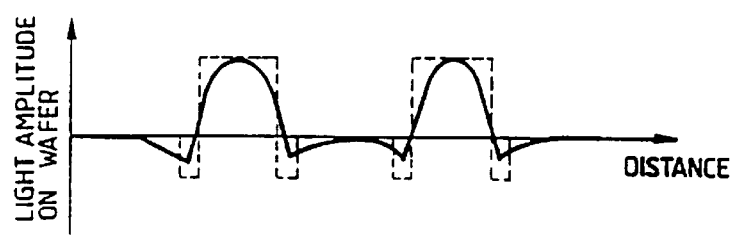
FIG. 11(c)
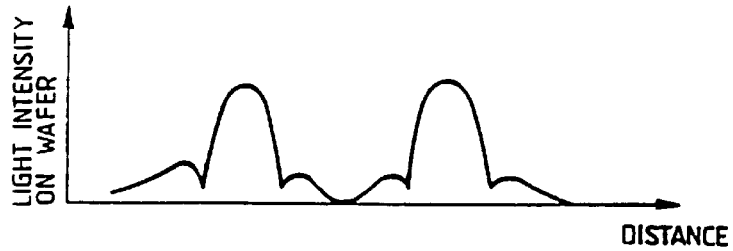
FIG. 11(d)
FIG. 12
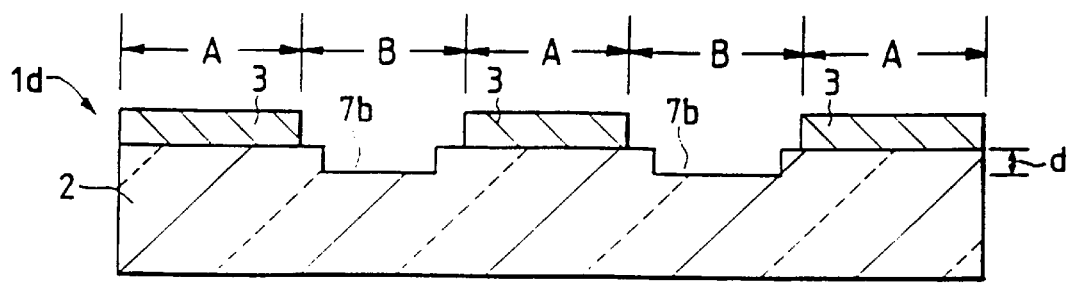

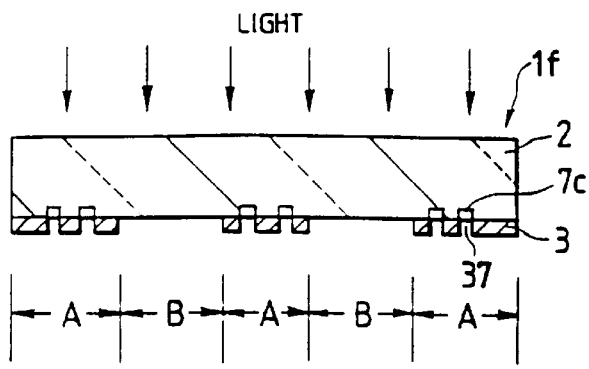
FIG. 22(a)
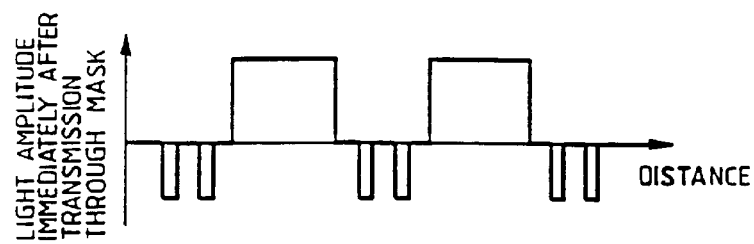
FIG. 22(b)
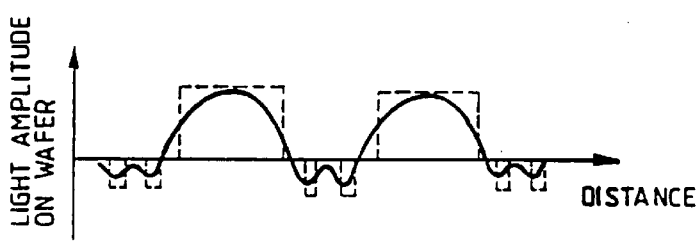
FIG. 22(c)
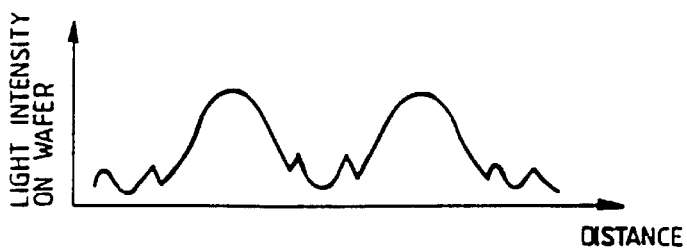
FIG. 22(d)
FIG. 23
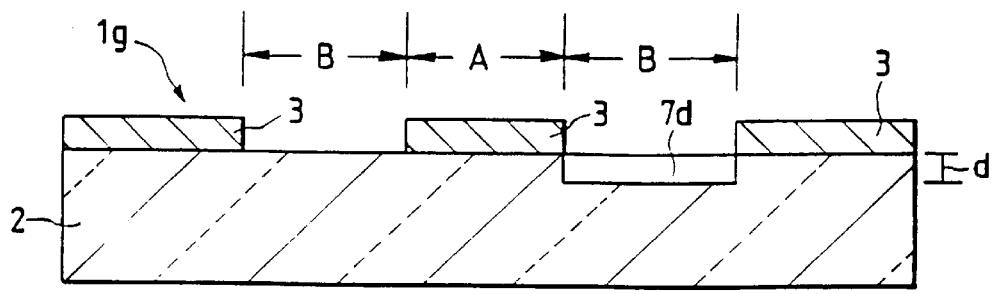

MASK FOR MANUFACTURING SEMICONDUCTOR DEVICE AND METHOD OF MANUFACTURE THEREOF

This is a Continuation application of application Ser. No. 09/099,332, filed Jun. 18, 1998, now U.S. Pat. No. 5,948,574, which is a Continuation application of application Ser. No. 08/829,233, filed Mar. 31, 1997, now U.S. Pat. No. 5,830,606, which is a Continuation application of application Ser. No. 08/631,000, filed Apr. 12, 1996, now U.S. Pat. No. 5,643,698, which is a Continuation application of application Ser. No. 08/449,926, filed May 25, 1995, now U.S. Pat. No. 5,631,108, which is a Divisional application of application Ser. No. 08/288,905, filed Aug. 11, 1994, now U.S. Pat. No. 5,484,671, which is a Divisional application of application Ser. No. 08/087,074, filed Jul. 7, 1993, now U.S. Pat. No. 5,358,807, which is a Continuation application of application Ser. No. 07/730,221, filed Jul. 15, 1991, now abandoned, which is a Continuation application of application Ser. No. 07/437,268, filed Nov. 16, 1989, now U.S. Pat. No. 5,045,417.

BACKGROUND OF THE INVENTION

The present invention relates to a mask for use in photolithography and its manufacturing technique, and particularly to a technique effectively applicable to a mask for use of manufacturing semiconductor integrated circuit device.

In recent years, very fine elements constituting a circuit, very fine wirings and very narrow spaces between the elements and wirings have been developed in semiconductor integrated circuit devices.

However, along with such development of the elements and wirings and of the spaces between elements and wirings, there arises a problem in that the accuracy of mask pattern transfer is lowered when an integrated circuit pattern is transferred onto a wafer by coherent light.

This problem will subsequently be described with reference to FIGS. 24(a)–(d).

When a given integrated circuit pattern formed on a mask 50 shown in FIG. 24(a) is transferred onto a wafer by a method of projection exposure or the like, the phases of lights each transmitted through each of a pair of transmission regions $P_1$, $P_2$ having light shield region N therebetween are identical to each other as shown in FIG. 24(b). Consequently, these interferential lights increase their intensities in light shield region N located between the abovementioned pair of transmission regions $P_1$, $P_2$ as shown in FIG. 24(c). As a result, as shown in FIG. 24(d) the contrast of a projected image on a wafer is not only lowered, but also the depth of focus becomes shallow, causing the transfer accuracy of the mask pattern to be considerably lowered.

As a means to counteract these problems, a technique of phase shifting lithography has been developed, whereby the phase of light transmitted through the mask is controlled so as to improve the resolution and contrast of the projected image. The phase shifting lithography technique is disclosed, for example, in Japanese Laid-Open Patent No. 173744/1983 and Japanese Laid-Open Patent No. 67514/1987.

In the above-mentioned Japanese Laid-Open Patent No. 173744/1983 there is described the structure of a mask having a light shield region and a pair of transmission regions, wherein a transparent material is arranged at least in either one of the transmission regions sandwiching the light shield region therebetween, allowing a phase difference to be generated between the lights each transmitted through each of transmission regions at the time of exposure and thus these lights being interfered with each other to weaken themselves in the region on a wafer which should primarily be a light shield region.

The function of the light transmitted through such a mask as above will subsequently be described with reference to FIGS. 25(a)–(d).

When a given integrated circuit pattern formed on a mask 51 shown in FIG. 25(a) is transferred onto a wafer by the method of projection exposure or the like, a phase difference of 180° is generated between the phase of light transmitted through a transmission region $P_2$ having transparent material 52 of a pair of transmission regions $P_1$, $P_2$ which have light shield region N sandwiching therebetween and the phase of light transmitted through the normal transmission region $P_1$ as shown in FIGS. 25(b) and (c). Therefore, the lights transmitted through the pair of transmission regions $P_1$, $P_2$ interfere with each other to offset them in light shield region N located between these transmission regions $P_1$, $P_2$. Consequently, as shown in FIG. 25(d), the contrast of a projected image on a wafer is improved. Thus, the resolution and depth of focus is improved, resulting in a higher accuracy of pattern transfer of the mask 51.

Also, in the above-mentioned Japanese Laid-Open Patent No. 67514/1987, there is described the structure of a mask having a light shield region formed by light shielding film and a transmission region formed by removing the light shielding film, wherein a fine aperture pattern is formed by removing a part of shielding film and at the same time, a phase shifting layer is provided on either one of the transmission region or the aperture pattern, and thus a phase difference is generated between the lights transmitted through the transmission region and the aperture pattern, preventing the distribution of amplitude of light transmitted through the transmission region from being spread in the horizontal direction.

SUMMARY OF THE INVENTION

Nevertheless, the present inventor has found that the conventional technique disclosed in the above-mentioned Japanese Laid-Open Patent No. 173744/1983 has the following problem:

The above-mentioned conventional technique in which a phase difference is generated between the lights transmitted through the pair of transmission regions does not has any problem as far as a pattern is simply and unidimensionally arranged in a repetitive manner. However, in the case that the pattern is complicated as in an actual integrated circuit pattern, the arrangement of the transparent material may be impossible, and a problem arises in that sufficient resolution is not obtained at some sections.

For example, in the case of an integrated circuit pattern 53 shown in FIG. 26. If transparent material is arranged in a transmission region $P_2$, the resolutions in light shield regions $N_1$ and $N_2$ are certainly improved. However, if transparent material is arrange din transmission region $P_1$ in order to improve the resolution in light shield region $N_3$, the lights transmitted through transmission regions $P_1$, $P_2$ will have an identical phase, causing the resolution in light shield region $N_2$ to be lowered. Also, in order to improve the resolution in the light shield region $N_3$, a transparent material should be provided in such a transmission region as the transmission region $P_3$. Then, the transparent material can be arranged in a part of transmission region $P_3$. In such a case, however, there appears the reversing of phases in the lights transmitted through the same transmission region $P_3$, and an unwanted pattern is formed on a wafer. Consequently, it becomes impossible to improve the resolution in light shield region $N_3$.

Furthermore, if the pattern is complicated like an actual integrated circuit one, the arrangement of transparent material is restricted as mentioned above. This makes it difficult to prepare the pattern data of the transparent material. Conventionally, therefore, the pattern of the transparent material should be produced specially while taking into consideration the above-mentioned restriction on the arrangement when a mask having means for shifting phase of light is manufactured.

On the other hand, the known technique disclosed in Japanese Laid-Open Patent No. 67514/1987, whereby an aperture pattern is formed in light shield region so as to generate a phase contrast between the light transmitted through the aperture pattern and the one transmitted through the transmission region, makes it difficult to arrange the aperture pattern, the same as in the case of the above-mentioned publication, if a pattern is as complicated and extremely fine as an actual integrated circuit pattern. For example, should the width of pattern of light shield region become narrower, there arises a problem in that the arrangement of an aperture pattern is difficult.

Furthermore, in this conventional technique, no consideration is given as to the lowering of light intensity at the corners of transmission region which takes place along with a further miniaturization of transmission region required, resulting in a problem posed in that the corners of a projected image are rounded.

The present invention is to solve the above-mentioned problems, and the object thereof is to provide a technique whereby the transfer accuracy of a pattern formed on a mask can be improved.

Another object of the present invention is to provide a technique whereby the manufacturing time of a mask having means for shifting phase of light can be reduced.

Still another object of the present invention is to provide a technique whereby the resolution of not only each side of a projected image but also of each corner thereof can be improved.

Among the inventions to be disclosed in the present application, those typical ones will subsequently be described.

Now, the first invention is a mask having light shield and transmission regions and transferring a given pattern at least by irradiation of coherent light locally, wherein a phase shifting portion is formed in a part of the aforementioned transmission region for shifting a phase of light transmitted, and a phase contrast is generated between the light transmitted through the aforementioned phase shifting portion and the light transmitted through the transmission region where the aforementioned phase shifting portion is not formed, and the aforementioned phase shifting portion is so arranged that the interferential lights of the aforementioned lights can weaken themselves in the boundary area of the aforementioned transmission and light shield regions.

The second invention is the method of manufacturing a mask wherein the pattern data of the phase shifting portion can automatically be prepared in accordance with the pattern data of the light shield region.

The third invention is a mask in which light shield and transmission regions are provided on a mask substrate and a given pattern in the mask is transferred at least by the irradiation of coherent light locally, wherein a groove having a depth to reach the main surface of the aforementioned mask substrate is formed, and simultaneously a phase contrast is generated between the light transmitted through the aforementioned groove and the light transmitted through the aforementioned transmission region, and a phase shifting groove is formed on the aforementioned mask substrate located below the aforementioned groove so as to allow the interferential lights of the aforementioned lights to weaken themselves at the end portion of the aforementioned light shield region.

The fourth invention is a mask in which light shield and transmission regions are provided on a mask substrate, and a given pattern is transferred at least by the irradiation of coherent light locally, wherein a groove having a depth to reach the main surface of the aforementioned mask substrate is formed in a part of the aforementioned light shield region, and a phase contrast is generated between the light transmitted through the aforementioned groove and the light transmitted through the aforementioned transmission region, and a transparent film is provided above the aforementioned groove so as to allow the interferential lights of the aforementioned lights to weaken themselves at the end portion of the aforementioned light shield region, and simultaneously, subtransmission regions are formed at the corners of the aforementioned transmission region.

According to the first invention mentioned above, the light transmitted through the phase shifting portion and the light transmitted through the portion where it is not formed interfere with each other to weaken themselves at the boundary portion of transmission and light shield regions so that the bleeding of contour of an image projected on a wafer can be reduced, and the contrast of the projected image can be improved considerably, resulting in a remarkable improvement of the resolution and depth of focus.

Particularly, in the present invention, no restriction on the arrangement of phase shifting portion takes place no matter how complicated the pattern is on the mask. Also, there is no difficulty in arranging the phase shifting portion no matter how narrow the width of pattern becomes in the light shield region.

According to the second invention mentioned above, the manufacturing time of a mask having means for shifting the phase of light can be reduced considerably because there is no need for preparing specially any pattern data of transparent film or phase shifting groove.

According to the third invention mentioned above, the light transmitted through the groove and phase shifting groove interfere with each other to weaken themselves, making it possible to reduce the bleeding of contour of a projected image and to improve the contrast thereof so that the solution and depth of focus can be improved remarkably.

According to the fourth invention mentioned above, the light intensity at the corner of a transmission region increases by the arrangement of a sub-transmission region threat so that not only the resolution at each side of a projected image, but also the resolution at the corner thereof can be improved.

BRIEF DESCRIPTION OF THE DRAWINGS

FIG. 1 is a sectional view of the principal part of a mask embodying the present invention, FIGS. 2(a)–(c) are sectional views illustrating the principal part of the mask in the respective processes of the manufacture thereof, FIG. 11(a) is a sectional view of the mask shown in FIG. 6 in a state of exposure, FIGS. 11(b)–(d) are diagrams representing the amplitude and intensity of the light being transmitted through the transmission region of the mask shown in FIG. 6, FIG. 12 is a sectional view of the principal part of another mask embodying the present invention.

FIG. 22(a) is a sectional view of the mask shown in FIGS. 20 and 21 in a state of exposure, FIGS. 22(b)–(d) are diagrams representing the amplitude and intensity of the light being transmitted through the transmission region, FIG. 23 is a sectional view of the principal part of still another mask embodying the present invention.

DESCRIPTION OF A PREFERRED EMBODIMENT

[Embodiment 1]

Figure 3A:
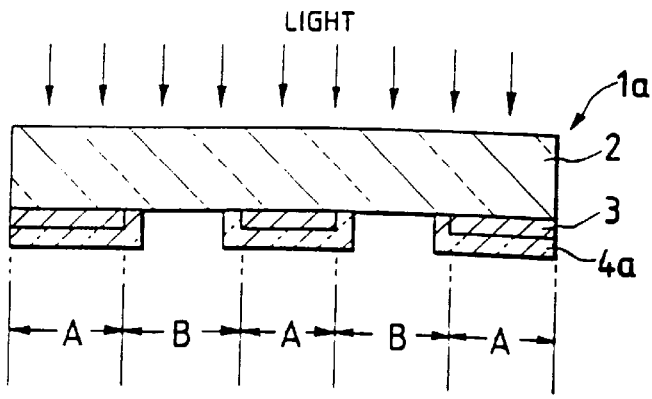
FIG. 3(a) is a sectional view of the mask shown in FIG. 1 in a state of exposure.
Figure 3B:
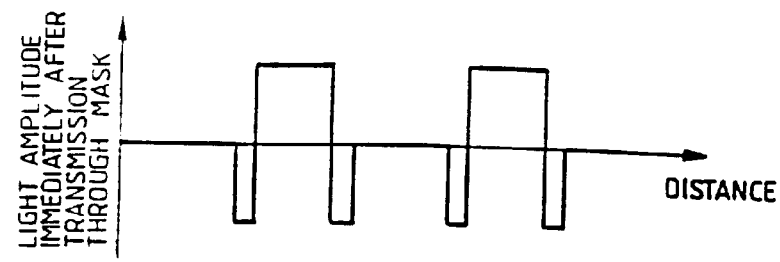
FIG. 3(b)–(d) are diagrams representing the amplitude and intensity of the light being transmitted through the transmission region of the mask.
Figure 3C:
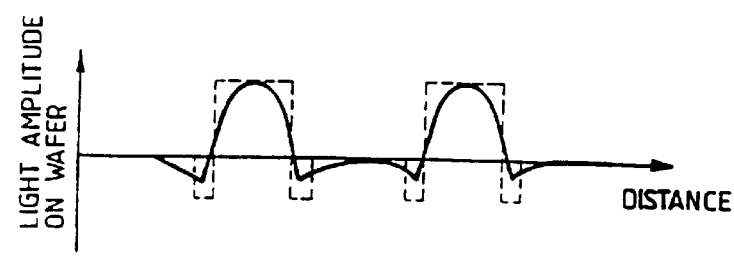
Figure 3D:
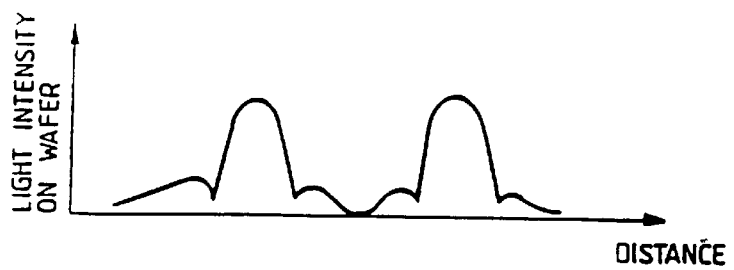

FIG. 1 is a sectional view of the principal part of a mask embodying the present invention, and FIGS. 2(a)–(c) are sectional views illustrating the principal part of the mask in the respective processes of the manufacture thereof, FIG. 3(a) is a sectional view of the mask shown in FIG. 1 in a state of exposure, and FIGS. 3(b)–(d) are diagrams representing the amplitude and intensity of the light being transmitted through the transmission region of the mask.

Mask 1a in FIG. 1 of Embodiment 1 is, for example, a reticle used at a given process in manufacturing a semiconductor integrated circuit device. Also, the original pattern of an integrated circuit, which is, for example, five times its actual dimensions, is formed on the mask 1a of Embodiment 1.

Transparent mask substrate (hereinafter referred to simply as substrate) 2 constituting mask 1a is made of synthetic quartz glass or the like having, for example, a refractive index of 1.47. On the main surface of substrate 2, metal layer 3 of, for example, 500–3,000 Å thick is patterned in a given shape.

Metal layer 3 comprises, for example, a Cr film so that it will constitute a light shield region A at the time of exposure. Also, metal layer 3 may be of a laminating construction having chromium oxide laminated on the upper layer of a Cr layer surface.

Furthermore, the portion where the metal layer 3 has been removed constitutes a transmission region B, and the original pattern of the integrated circuit formed on mask 1a comprises of the light shield region A and the transmission region B.

In mask 1a of Embodiment 1, transparent film 4a formed in a pattern slightly wider than that of the above-mentioned pattern of metal layer 3 is provided on mask 1a in such a manner that its part extends over the contour of metal layer 3 into the transmission region B. Consequently, on transmission region B comprises of the region which is covered by transparent film 4a and the region which is not covered thereby.

Transparent film 4a is formed, for example, with indium oxide (InOx). A material having a sufficiently high transmittance against substrate 2 (at least more than 90% required) as well as an excellent property of adhesiveness to substrate 2 should be selected as a material for transparent film 4a. The width of the excessive portion of transparent film 4a is approximately 0.5 $\mu$m, provided that, for example, the width of pattern of transmission region B is approximately 2 $\mu$m. Given the thickness of transparent film 4a measured from the main surface of substrate 2 is $x_1$, the refractive index of transparent film 4a is $n_1$, and the wavelength of light irradiated at the time of exposure is $\lambda$, transparent film 4a is formed to satisfy the relation of $x_1=\lambda/[2(n_1-1)]$. This relation is maintained in order to generate a phase contrast of 180° at the time of exposure between the light transmitted through transparent film 4a and the one through the normal transparent film 4a and the one through the normal transmission region B in one transmission region B. For example, if the wavelength $\lambda$ of light irradiated at the time of exposure is 0.365 μm (i line) and the refractive index $n_1$ of transparent film 4a is 1.5, the thickness $x_1$ of transparent film 4a measured from the main surface of substrate 3 will be approximately 0.37 μm. Although not shown in the drawing, an alignment mark is provided on mask 1a to align its position with that of metal layer 3 when, for example, transparent film 4a is formed.

Next, the method of manufacturing mask 1a of Embodiment 1 will be described with reference to FIGS. 2(a)–(c).

First, the surface of transparent substrate 2 made of synthetic quartz glass or the like is ground, and after it is cleaned, metal layer 3 made of Cr or the like of, for example, approximately 500–3,000 Å is formed on its main surface by sputtering or others as shown in FIG. 2(a). Subsequently, on the metal layer 3, photoresist (hereinafter referred to as resist) 5a of, for example, 0.4–0.8 μm will be coated. Then, after resist 5a is prebaked, a given portion of 5a is irradiated with electron beam E by the electron beam exposure method or the like in accordance with the integrated circuit pattern data with the integrated circuit pattern data of a semiconductor integrated circuit device coded and stored in advance in a magnetic tape which is not shown in the drawing. In the integrated circuit pattern data, the position coordinate, shape or others are also stored.

Next, as shown in FIG. 2(b), the exposed portion of resist 5a, for example, is removed by a developing solution. Then, the exposed metal layer 3 is removed by etching with a dry etching method or the like to gain the pattern of a given shape.

Subsequently, resist 5a is removed by an exfoliative agent and substrate 2 is cleaned. Then, after inspection, as shown in FIG. 2(c), the main surface of substrate 2 is covered with transparent film 4a of indium oxide ($InO_x$) or others by a sputtering method or the like. At this juncture, the thickness $x_1$ of the transparent film measured from the main surface of substrate 2 is, for example, approximately 0.37 μm.

After that, the upper surface of transparent film 4a is coated with resist 5b of, for example, 0.4–0.8 μm and furthermore, on its upper surface, an aluminum antistatic layer 6 of, for example, 0.05 μm thick is formed by a sputtering method or the like.

Subsequently, the pattern formed on transparent film 4a will be transferred to resist 5b by an electron beam exposure system or the like in accordance with the pattern data of transparent film 4a.

The pattern data of transparent film 4a is automatically formed by magnifying or demagnifying the light shield region A or transmission region B of the above-mentioned pattern data of the integrated circuit. In embodiment 1, for example, the pattern data of transparent film 4a is automatically formed by thickening the pattern width of light shield region A by, for example, approximately 0.5–2.0 μm.

Then, mask 1a shown in FIG. 1 will be produced through the processes of development, etching of a predetermined portion of transparent film 4a, removal of resist 5b, cleaning, inspection and others.

In order to transfer the pattern of the integrated circuit formed on mask 1a onto a wafer covered with resist by use of the mask 1a thus produced, the following steps will be taken, for example.

Mask 1a and a wafer are set on a projection aligner for demagnification (which is not shown in the drawing), whereby the original pattern of integrated circuit on mask 1a is projected on a wafer after it has been reduced to ⅕ optically, and each time the wafer is sequentially moved step by step, projection and exposure are repeated so that the pattern of the integrated circuit formed on mask 1a can be transferred onto the entire surface of the wafer.

Next, the function of Embodiment 1 will be described with reference to FIGS. 3(a)–(d).

In mask 1a of Embodiment 1 shown in FIG. 3(a), a phase contrast of 180° is generated between the light transmitted through transparent film 4a and the one through the normal transmission region B (FIGS. 3(b) and (c)) in each of transmission regions B of mask 1a when the original pattern of a given integrated circuit formed on mask 1a is transferred onto a wafer by a projection aligner for demagnification or others.

Here, the lights transmitted through the same transmission region B having reverse phases respectively weaken each other at the boundary area of transmission region A and light shield region B because transparent film 4a is arranged around transmission region B. As a result, the bleeding of a contour of image projected on the wafer is reduced so as to improve the contrast of the projected image considerably. Thus, the resolution and depth of focus will remarkably be improved (FIG. 3(d)). Also, since light intensity is the square of light amplitude, the waveform in a negative side is reversed to a positive side as shown in FIG. 3(d).

In this way, it is possible to attain the following effect according to Embodiment 1:

(1). While lights are being transmitted through each of the transmission regions B at the time of exposure, a phase contrast of 180° is generated between the light transmitted through transparent film 4a and the one through the region which is not covered with transparent film 4a. These lights thus transmitted weaken each other at the boundary area of light shield region A and transmission region B, making it possible to reduce the bleeding of contour of image projected on the wafer. As a result, the contrast of the projected image is considerably improved so that the resolution and depth of focus can be improved remarkably.

(2). Through (1) mentioned above, more tolerance for exposure can be allowed.

(3) Since a phase contrast can be generated within one transmission region B, the arrangement of transparent film 4a is not restricted no matter how complicated the pattern is on mask 1a. Also, the arrangement of transparent film 4a can be made with ease no matter how narrow the pattern width is in light shield region A. Consequently, the pattern transfer accuracy will never be lowered locally even when a pattern formed on mask 1a is highly complicated and fine like the pattern of an integrated circuit so that the pattern transfer accuracy of the entire pattern formed on mask 1a can be improved remarkably.

(4). The pattern data of transparent film 4a can be obtained automatically based on the pattern data of light shield region A or transmission region B, making it possible to prepare the pattern data of transparent film 4a in a short period of time and also with ease. As a result, a remarkable reduction in time required for the manufacture of a phase shifting mask can be achieved.

[Embodiment 2]

Figure 4:
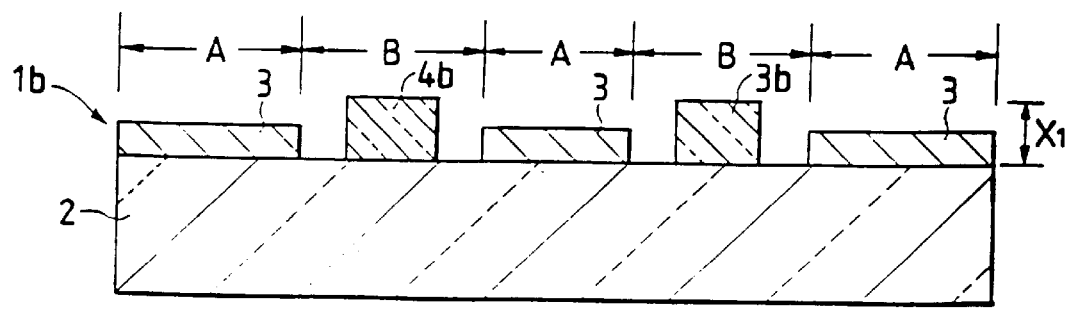
FIG. 4 is a sectional view of the principal part of another mask embodying the present invention.
Figure 5A:
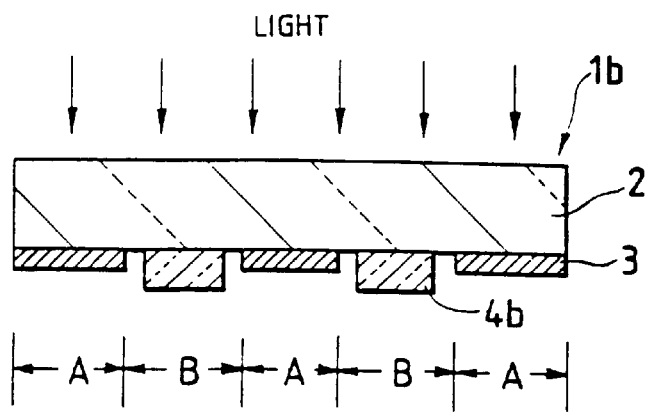
FIG. 5(a) is a sectional view of the mask shown in FIG. 4 in a state of exposure.
Figure 5B:
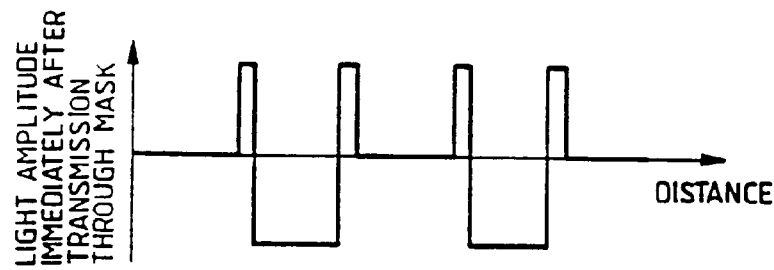
FIGS. 5(b)–(d) are diagrams representing the amplitude and intensity of the light being transmitted through the transmission region of the mask shown in FIG. 4.
Figure 5C:
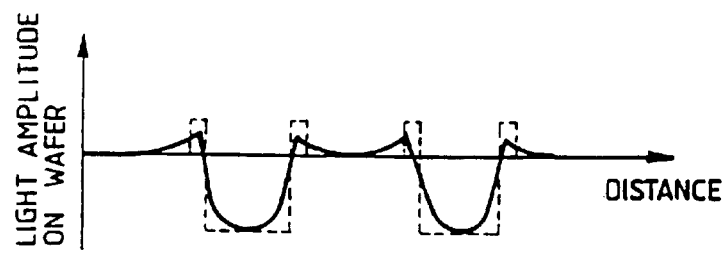
Figure 5D:
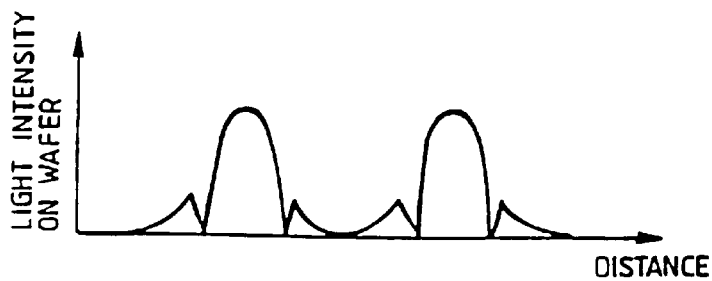

FIG. 4 is a sectional view of the principal part of another mask embodying the present invention, FIG. 5(a) is a sectional view of the mask shown in FIG. 4 in a state of exposure, FIGS. 5(b)–(d) are diagrams representing the amplitude and intensity of the light being transmitted through the transmission region of the mask in FIG. 4.

In mask 1b of Embodiment 2 shown in FIG. 4, transparent film 4b is arranged in the vicinity of the central part of transmission region B.

In this case, too, transparent film 4b is formed on substrate 2 in such a manner that its thickness $x_1$ will satisfy the relation of $x_1=\lambda/[2(n_1-1)]$ so as to generate as shown in FIG. 5(d) the phase contrast of 180° between the light transmitted through transparent film 4b and the one through the normal transmission region B in each of transmission regions B, B of mask 1b (FIGS. 5(b) and (c)). These lights thus transmitted will weaken each other at the boundary area of transmission region B and adjacent light shield regions A, A so that the bleeding of contour of the image projected on a wafer can be reduced. As a result, the contrast of a projected image can be considerably improved, making it possible to improve the resolution and depth of focus remarkably (FIG. 5(d)).

Also, in this case, the pattern data of transparent film 4b can automatically be prepared by thinning by a given dimension the width of a pattern of transmission region B which has been obtained by reversing the positive pattern data of, for example, an integrated circuit pattern to the negative one.

According to Embodiment 2, therefore, the same effects as in the aforementioned Embodiment 1 can be attained.

[Embodiment 3]

Figure 6:
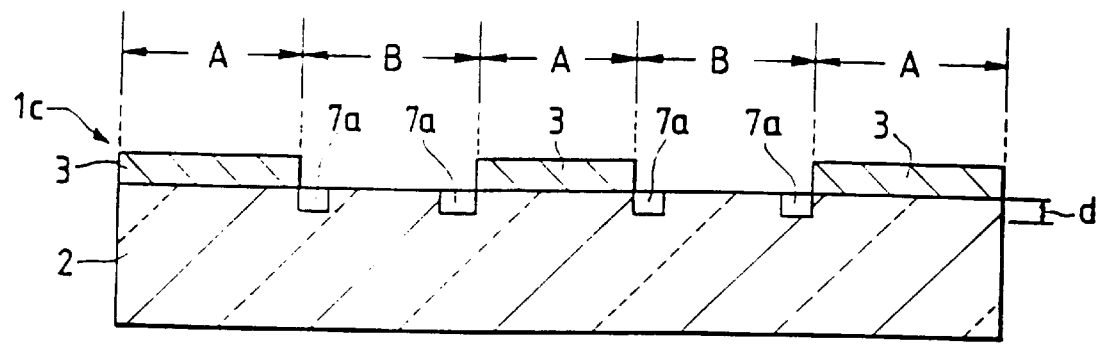
FIG. 6 is a sectional view of the principal part of another mask embodying the present invention.
Figure 7:
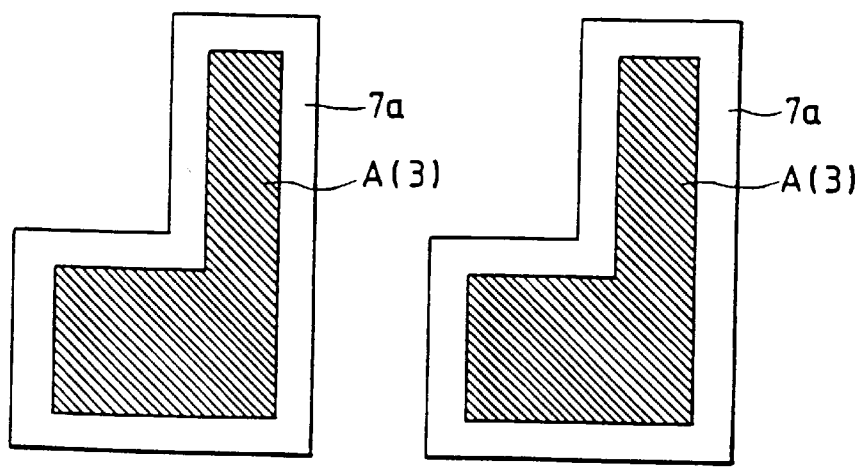
FIG. 7 shows top plan views of the principal part of the mask shown in FIG. 6.
Figure 8:
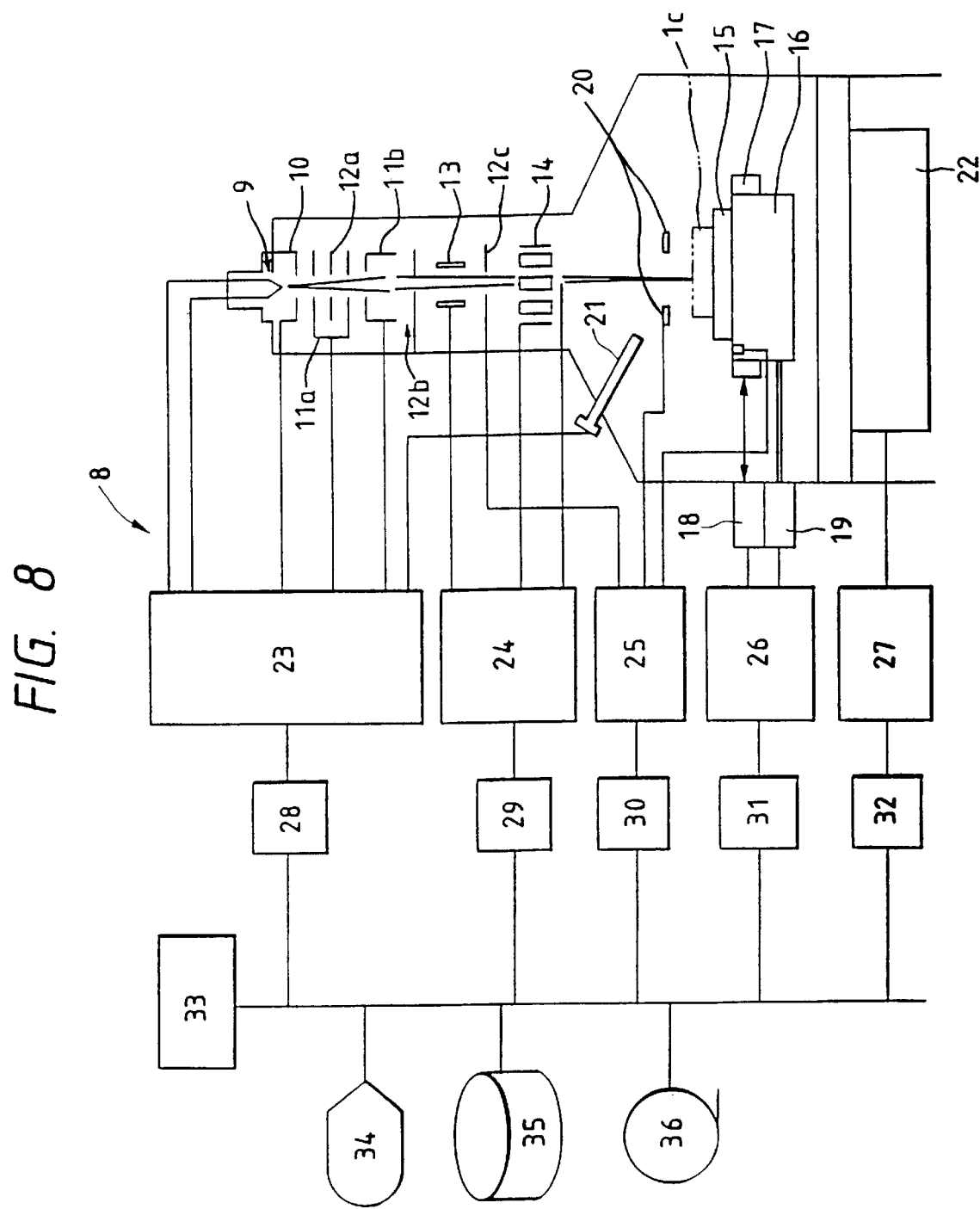
FIG. 8 illustrates the construction of a focused ion beam system employed in the manufacture of the mask, FIGS. 9(a) and (b) are sectional views illustrating the principal part of the mask in the respective processes of the manufacture thereof.
Figure 9A:
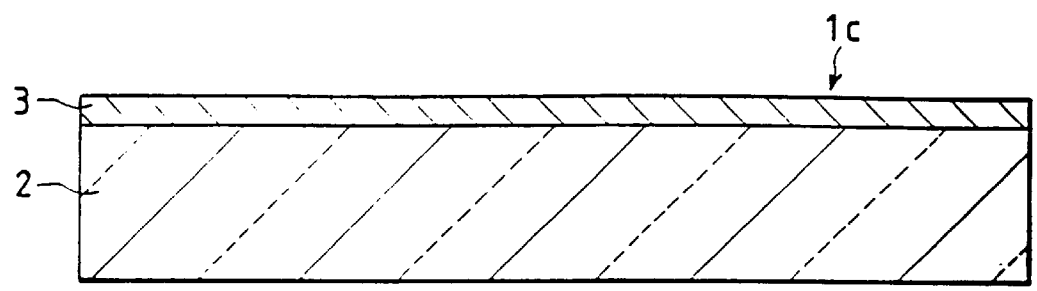
Figure 10:
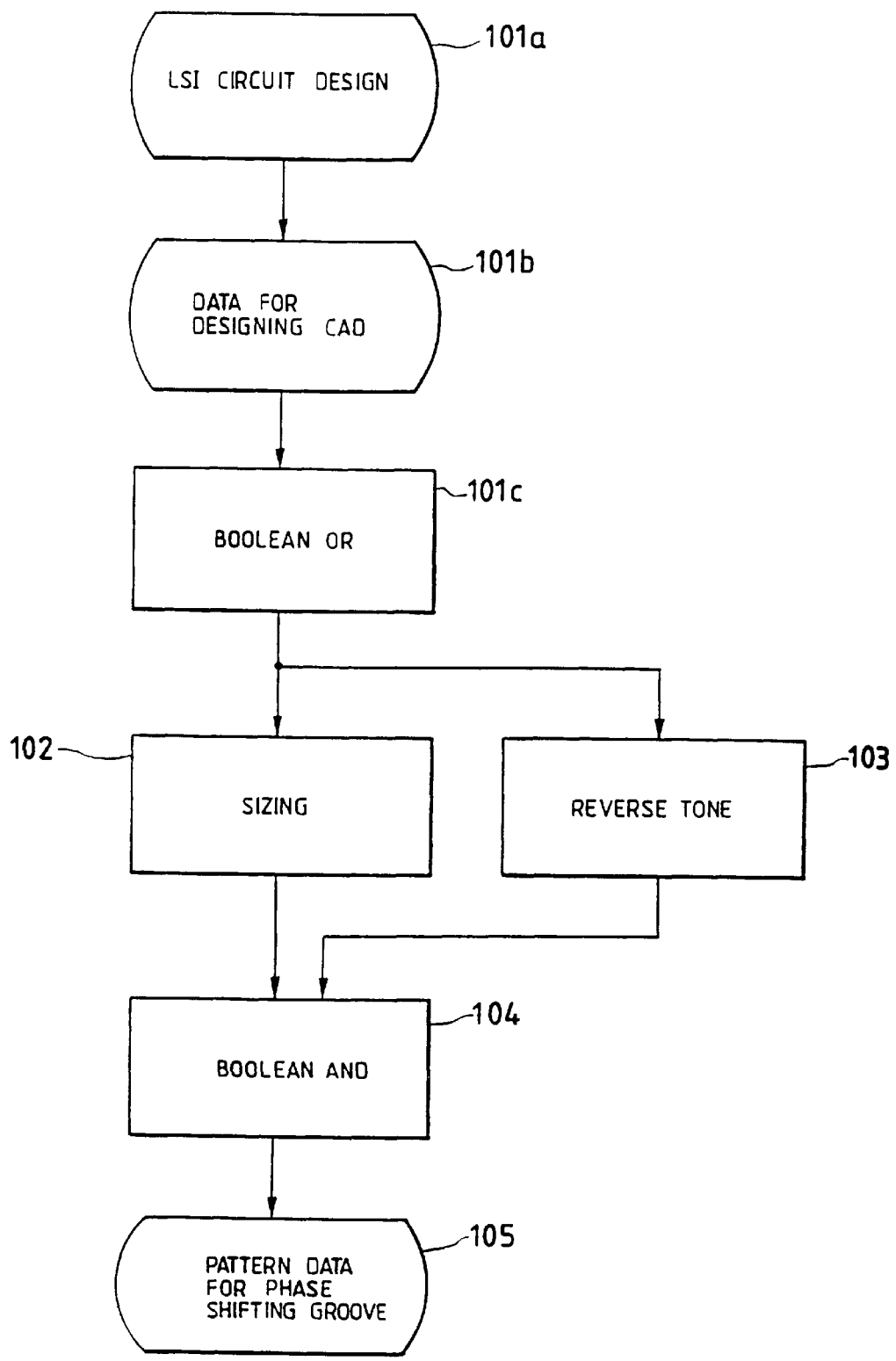
FIG. 10 is a flow chart representing the procedures through which the pattern data for a phase shifting groove are prepared.

FIG. 6 is a sectional view of the principal part of another mask embodying the present invention, FIG. 7 shows top plan views of the principal part of the mask shown in FIG. 6, FIG. 8 illustrates the construction of a focused ion beam system, FIGS. 9(a) and (b) are sectional views illustrating the principal part of the mask in the respective processes of the manufacture thereof, FIG. 10 is a flow chart representing the procedures through which the pattern data for a phase shifting groove are obtainable, FIG. 11(a) is a sectional view of the mask shown in FIG. 6 in a state of exposure, and FIGS. 11(b)–(d) are diagrams representing the amplitude and intensity of the light being transmitted through the transmission region of the mask shown in FIG. 6.

The mask of Embodiment 3 will subsequently be described with reference to FIGS. 6 and 7. The crosshatching in FIG. 7 shows the light shield region A.

In mask 1c of Embodiment 3, phase shifting groove 7a is formed on substrate 2 instead of transparent film 4a of aforementioned Embodiment 1 as a means for generating a phase contrast between the lights being transmitted through transmission region B at the time of exposure.

Phase shifting groove 7a is arranged around transmission region B. In other words, phase shifting groove 7a is arranged along the contour of metal layer 3. The width of phase shifting groove 7a is approximately 0.5 μm if the pattern width of transmission region B is given to be, for example, approximately 2.0 μm. Then, phase shifting groove 7a is formed to satisfy the relation of $d=\lambda/[2(n_2-1)]$ where d is the depth thereof, $n_2$ is the refractive index of substrate 2, and λ is the wavelength of light irradiated at the time of exposure. This relation is maintained to generate a phase contrast of 180° between the phase of light transmitted through phase shifting groove 7a and that of light through the normal transmission region B in the lights being transmitted through each of transmission regions B at the time of exposure. For example, in case where the wavelength λ of the light irradiated at the time of exposure is given to be 0.365 μm (i line), the depth d of phase shifting groove 7a can be approximately 0.39 μm. Also, although not shown in the drawing, an alignment mark is provided on mask 1c when, for example, phase shifting groove 7a is formed to align its position with that of metal layer 3.

Next, a focused ion beam system 8 for use in manufacturing mask 1c will be described with reference to FIG. 8.

Inside ion source 9 installed above the system body, such a dissolved liquid metal as gallium (Ga) or the like, for example, is contained, though not shown in the drawing. Below ion source 9, with drawable electrode 10 is installed, beneath which is provided the first lens electrode 11a and the first aperture electrode 12a formed by static lens. Below aperture electrode 12a, the second lens electrode 11b, the second aperture electrode 12b, blanking electrodes 13 for controlling the on/off of beam irradiation, and then third aperture electrode 12c and deflection electrode 14 are installed.

With the formation of each electrode thus installed, the ion beam emitted from ion source 9 is irradiated under the controls of the above-mentioned blanking electrodes 13 and deflection electrode 14 onto the mask 1c which is held by holder 15 with patterns yet to be formed thereon. Then, metal layer 3 or substrate 2 can be processed be etching with the ion beam by setting at the time of scanning beforehand its irradiation time and scanning numbers per unit of pixel of, for example, 0.02×0.02 μm.

Holder 15 is installed on the sample stand 16 movable in the directions X and Y, and sample stand 16 can be positioned by sample stand driving motor 19 when its position is recognized by laser interferometer 18 through laser mirror 17 installed at the side of the sample stand. Also, above holder 15, there is installed secondary ion and secondary electron detector 20 so that the secondary ion and secondary electron generated by a workpiece can be detected. Furthermore, electron shawer radiating member 21 is installed above secondary ion and secondary electron detector 20 to prevent a workpiece from being electrified.

The inside of the processing system set forth above has a structure keeping itself under vacuum by vacuum pump 22 shown in the drawing below the above-mentioned sample stand 16. Also, each of the processing systems mentioned above is structurally controlled by each of the control members 23–27 installed outside the system body so that their operations are controlled, and each of the control members 23–27 is also controlled by controlling computer 33 through each of the interface members 28–32. Controlling computer 33 has terminal 34, magnetic disk unit 35 to record data, and MT deck 36.

Next, the method of manufacturing mask 1c of Embodiment 3 will be described with reference to FIG. 8, FIGS. 9(a) and (b) and FIG. 10.

First, as shown in FIG. 9(a), metal layer 3 of, for example, 500–3,000 Å is formed by sputtering or the like on the main surface of substrate 2 which has been ground and cleaned. Then, mask 1c is held by holder 15 of focused ion beam system 8.

Figure 9B:
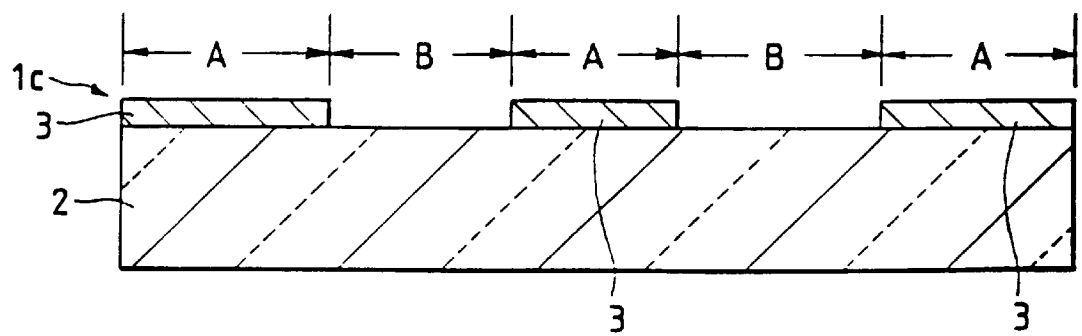

Next, and ion beam is charged from ion source 9. This ion beam is converged by each of the above-mentioned electrodes into a beam diameter of, for example, 0.5 μm. Then, an ion beam current of approximately 1.5 μA is obtained. Subsequently, this focused ion beam is irradiated onto a given portion of metal layer 3 in accordance with the pattern data of an integrated circuit pattern stored beforehand in a magnetic tape of MT deck 36. Then, metal layer 3 is etched. At this juncture, the irradiation time per pixel is, for example, $3\times10^{-6}$ second, and the scanning numbers are approximately 30. Thus, as shown in FIG. 9(b), metal layer 3 is patterned. The patterning of metal layer 3 may also be carried out by an electron beam exposure method or the like as in the aforementioned Embodiment 1.

After this, a given quantity of ion beam is irradiated onto the alignment mark provided on mask 1c, which is not shown in the drawing, so as to detect a generated secondary electron by secondary ion secondary electron detector 20, and the position coordinates are computed in accordance with the detection data.

Then, based on the position coordinates of the alignment mark thus worked out, sample stand 16 is moved so that the ion beam can be irradiated onto the location where phase shifting groove 7a is formed.

Next, in accordance with the pattern data of phase shifting groove 7a, the ion beam is irradiated onto substrate 2, which has been exposed by the pattern formation of metal layer 3, along the contour of metal layer to form phase shifting groove 7a (FIG. 6). At this juncture, the depth, width and others of phase shifting groove 7a can be defined by the focused ion beam accurately with ease.

The pattern data of phase shifting groove 7a is prepared by a logic arithmetic operation on the pattern data of light shield region A (or transmission region B) and the pattern data obtainable by magnifying or demagnifying the pattern data of light shield region A (or transmission region B).

For example, as shown in FIG. 10, the pattern data of an integrated circuit is first prepared through the process of LSI circuit design (step 101a), CAD design data (101b), and Boolean or (101c), and then the data is produced by the sizing process (102) for the patterned data having the pattern width of light shield region A which has been thickened only by a given dimension. At the same time, the data for pattern data of transmission region B are prepared in the process of reverse tone (103) by reversing the positive pattern data of an integrated circuit pattern into the negative one. Then, the pattern data of phase shifting groove 7a are automatically prepared (105) by executing AND of these pattern data (104).

Next, after phase shifting groove 7a has been formed, the bottom face of phase shifting groove 7a formed on mask 1c is flattened by dry etching with a gas plasma of, for example, Freon ($CF_4$) or the like. With this flattening of the bottom face of phase shifting groove 7a, the operativity of phase of the light being transmitted through this groove can be improved. In this respect, when the dry etching treatment is carried out, a gas of Freon or the like is supplied for 20 scc/min to the inside of a treatment chamber of plasma dry etching, the pressure of which is reduced, for example, to 0.1 Torr.

In this way, mask 1c shown in FIGS. 6 and 7 is manufactured.

Next, the function of mask 1c of Embodiment 3 will be described with reference to FIGS. 11(a)–(d).

Now, when the original of a given integrated circuit pattern on mask 1c shown in FIG. 11(a) is transferred by a method of demagnifying projection exposure or the like, a phase contrast of 180° is generated (FIGS. 11(b) and (c)) between the light being transmitted through phase shifting groove 7a and the one through the normal transmission region B is each of transmission regions B of mask 1c.

Here, the lights transmitted through the same transmission region B having a reverse phase respectively weaken each other at the boundary area of transmission region B and light shield region A because phase shifting groove 7a is arranged around transmission region B of mask 1c. As a result, the bleeding of the contour of the projected image on a wafer can be reduced, and the contrast of a projected image and depth of focus can be improved remarkably (FIG. 11(d)). Also, since the light intensity is the square of the light amplitude, the waveform in the negative side of the light amplitude on a wafer will be reversed into the positive side of shown in FIG. 11(d).

Thus, the following effects can be attained according to Embodiment 3:

(1). While lights are being transmitted through each of the transmission regions B at the time of exposure, a phase contrast of 180° is generated between the light transmitted through phase shifting groove 7a and the one through the normal transmission region B. These lights thus transmitted weaken themselves each other at the boundary area of light shield region A and transmission region B, making it possible to reduce the bleeding of contour of image projected on a wafer. As a result, the contrast of projected image is considerably improved so that the resolution and depth of focus can be improved remarkably.

(2). Through (1) mentioned above, more tolerance for exposure can be allowed.

(3). Since a phase contrast can be generated within one transmission region B, the arrangement of phase shifting groove 7a is not restricted. Also, the arrangement of phase shifting groove 7a is not difficult no matter how narrow the pattern width is in light shield region A. Consequently, the pattern transfer accuracy will never be lowered locally even when a pattern formed on mask 1c is highly complicated and fine like the pattern of an integrated circuit so that the pattern transfer accuracy of the entire pattern formed on mask 1c can be improved remarkably.

(4). The pattern data of phase shifting groove 7a can be obtained automatically based on the pattern data of light shield region A or transmission region B, making it possible to prepare the pattern data of phase shifting groove 7a with ease and reduce its preparation time considerably.

(5). Since a means for shifting the phase of light can be the phase shifting groove 7a instead of the transparent film as in the aforementioned Embodiments 1 and 2, the process of forming a transparent film is no longer needed when mask 1c is manufactured.

(6). In addition to the above-mentioned (4) and (5), the phase shifting groove 7a can also be formed when the patterning of metal layer 3 is carried out by focused ion beam, so that the mask manufacturing process can be simplified as compared with the one using a transparent film as the means of shifting phase, and its manufacturing time can be reduced considerably.

(7). Since the manufacturing process of phase shifting mask can be simplified, exterior defects, adhesion of foreign materials, or any others are prevented effectively as compared with the mask using transparent film as means for shifting phase of light.

(8). In case of using phase shifting groove 7a, there is no deterioration of, for example, the quality of film, transmission rate, or adhesiveness to substrate 2 due to irradiation light or exposure light after the mask manufactured as in the case of using a transparent film for phase shifting.

(9). Through (8) mentioned above, the life of a mask can be prolonged as compared with the mask using the transparent film as the means for shifting the phase of light.

(10). Through (8) mentioned above, the accuracy of phase operation of light can be maintained longer than the mask using the transparent film as the means for shifting the phase of light.

(11). In the case of phase shifting groove 7a, there is no need of consideration for any deterioration of the quality of film and others as in the case of using a transparent film as the means for shifting the phase of light. Consequently, such treatment as ozone sulfuric acid cleaning at a high-temperature or high pressure water scribble cleaning or others can be conducted for mask 1c.

(12). Through (11) mentioned above, a removal treatment of foreign materials can be conducted better than the mask using a transparent film as the means for shifting the phase of light.

[Embodiment 4]

Figure 13A:
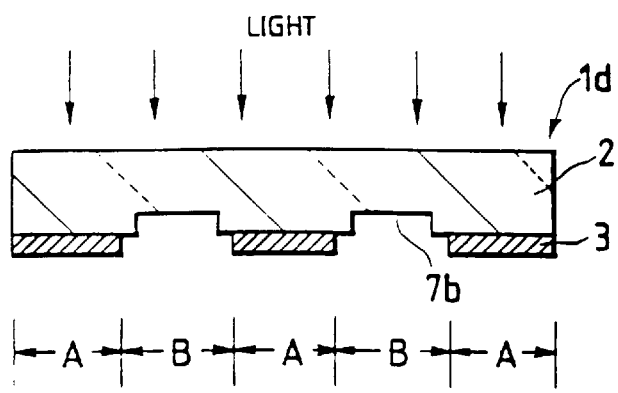
FIG. 13(a) is a sectional view of the mask shown in FIG. 12 in a state of exposure.

FIG. 12 is a sectional view of the principal part of another mask embodying the present invention, FIG. 13(a) is a sectional view of the mask shown in FIG. 12 in a state of exposure, and FIGS. 13(a)–(d) are diagrams representing the amplitude and intensity of the light being transmitted through the transmission region of the mask shown in FIG. 12.

In mask 1d of Embodiment 4 shown in FIG. 12, phase shifting groove 7b is arranged in the vicinity of the central part of transmission region B.

Figure 13B:
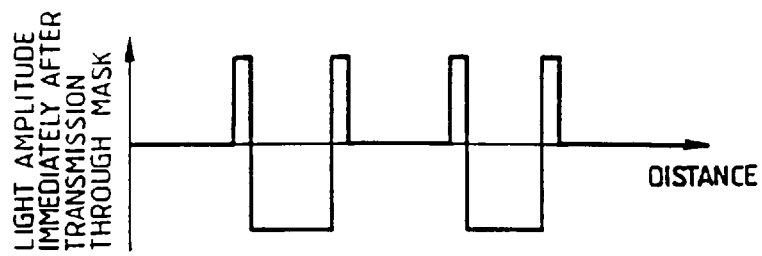
FIGS. 13(b)–(d) are diagrams representing the amplitude and intensity of the light being transmitted through the transmission region of the mask shown in FIG. 12.
Figure 13C:
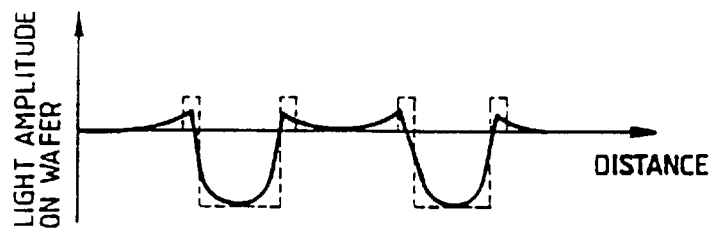
Figure 13D:

In this case, too, phase shifting groove 7b is formed on substrate 2 in such a manner that its depth d will satisfy the relation of $d=\lambda/[2(n_2-1)]$ so as to generate as shown in FIGS. 13(a)–(d) the phase contrast of 180° between the light transmitted through phase shifting groove 7b and the one through the normal transmission region B in each of transmission regions B, B of mask 1d (FIGS. 13(b) and (c)). These lights thus transmitted will weaken each other by the boundary area of transmission region B and adjacent light shield region A, A so that the bleeding of contour of the image projected on a wafer can be reduced. As a result, the contrast of a projected image can be considerably improved, making it possible to improve the resolution and depth of focus remarkably (FIG. 13(d)).

Also, in this case, the pattern data of phase shifting groove 7b can automatically prepared by thinning by a given dimension, the width of a pattern of transmission region B obtainable by reversing the positive pattern data of, for example, an integrated circuit pattern to the negative one.

According to Embodiment 4, therefore, the same effect as in the aforementioned Embodiment 3 can be attained.

[Embodiment 5]

Figure 14:
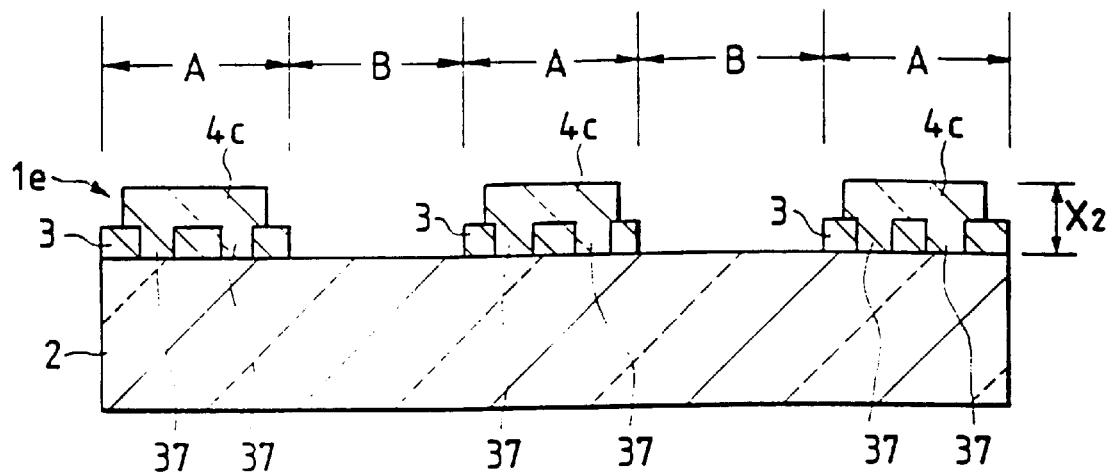
FIG. 14 is a sectional view of the principal part of still another mask embodying the present invention.
Figure 15:
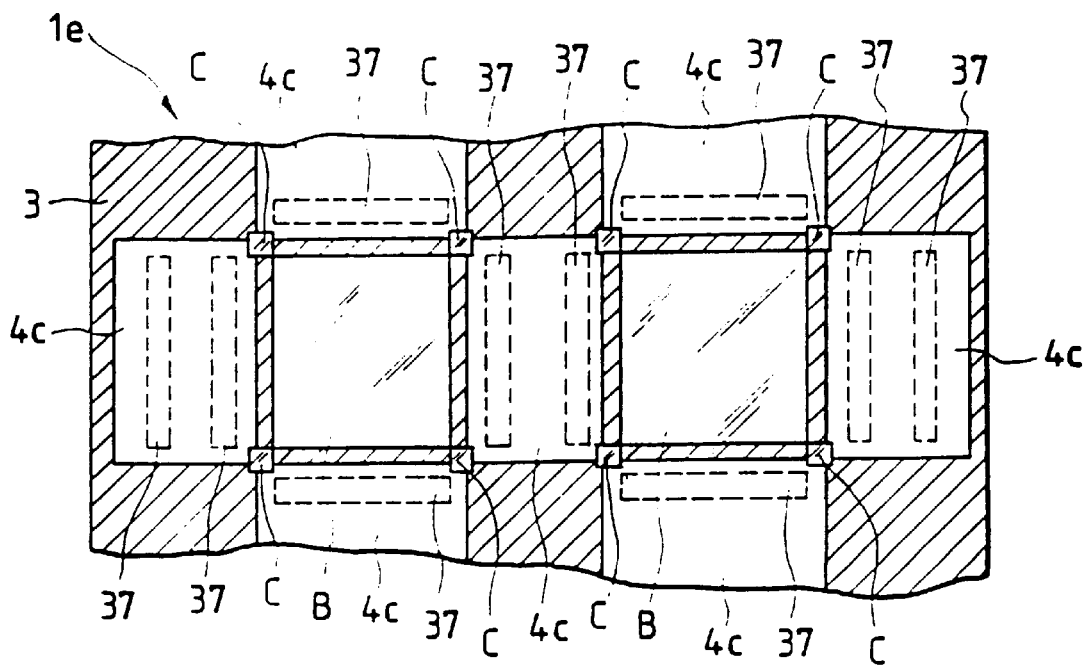
FIG. 15 is a top plan view of the principal part of the mask shown in FIG. 14.
Figure 16:
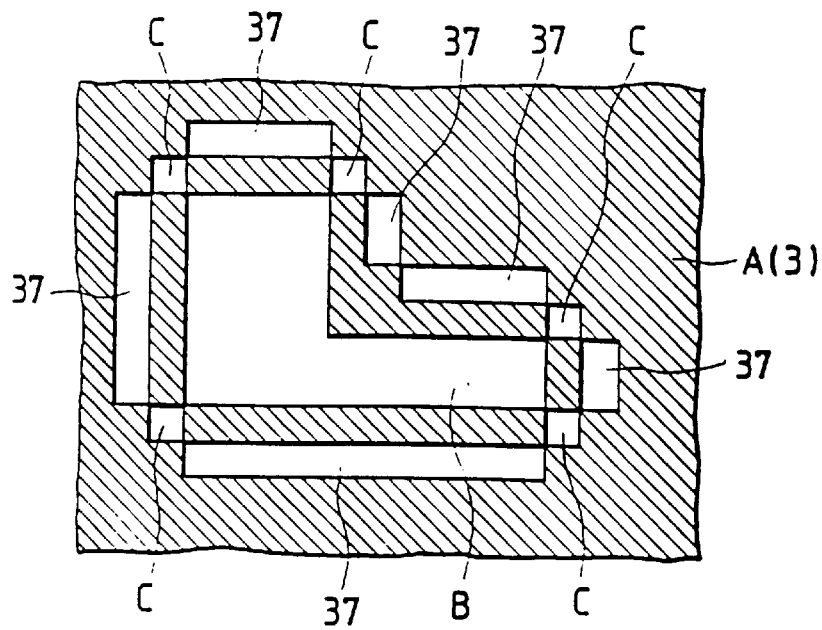
FIG. 16 is a top plan view of the principal part of a mask showing an example of pattern data for a groove and a sub-transmission region.
Figure 18A:
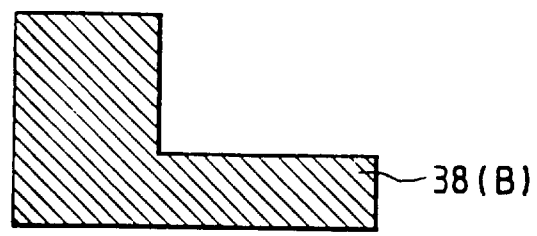
FIGS. 18(a)–(i) are illustrations showing the shapes of the pattern in the course of forming the pattern for the groove and sub-transmission region shown in FIG. 16.
Figure 18B:
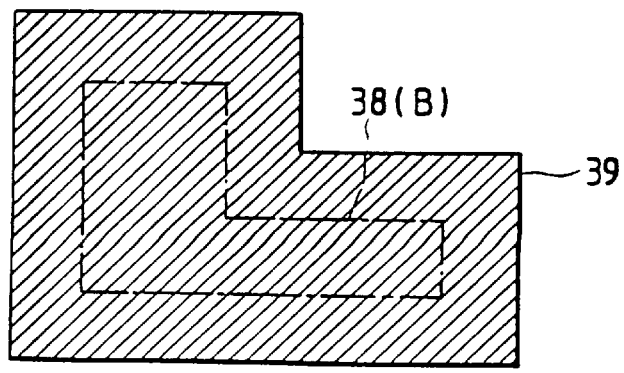
Figure 17:
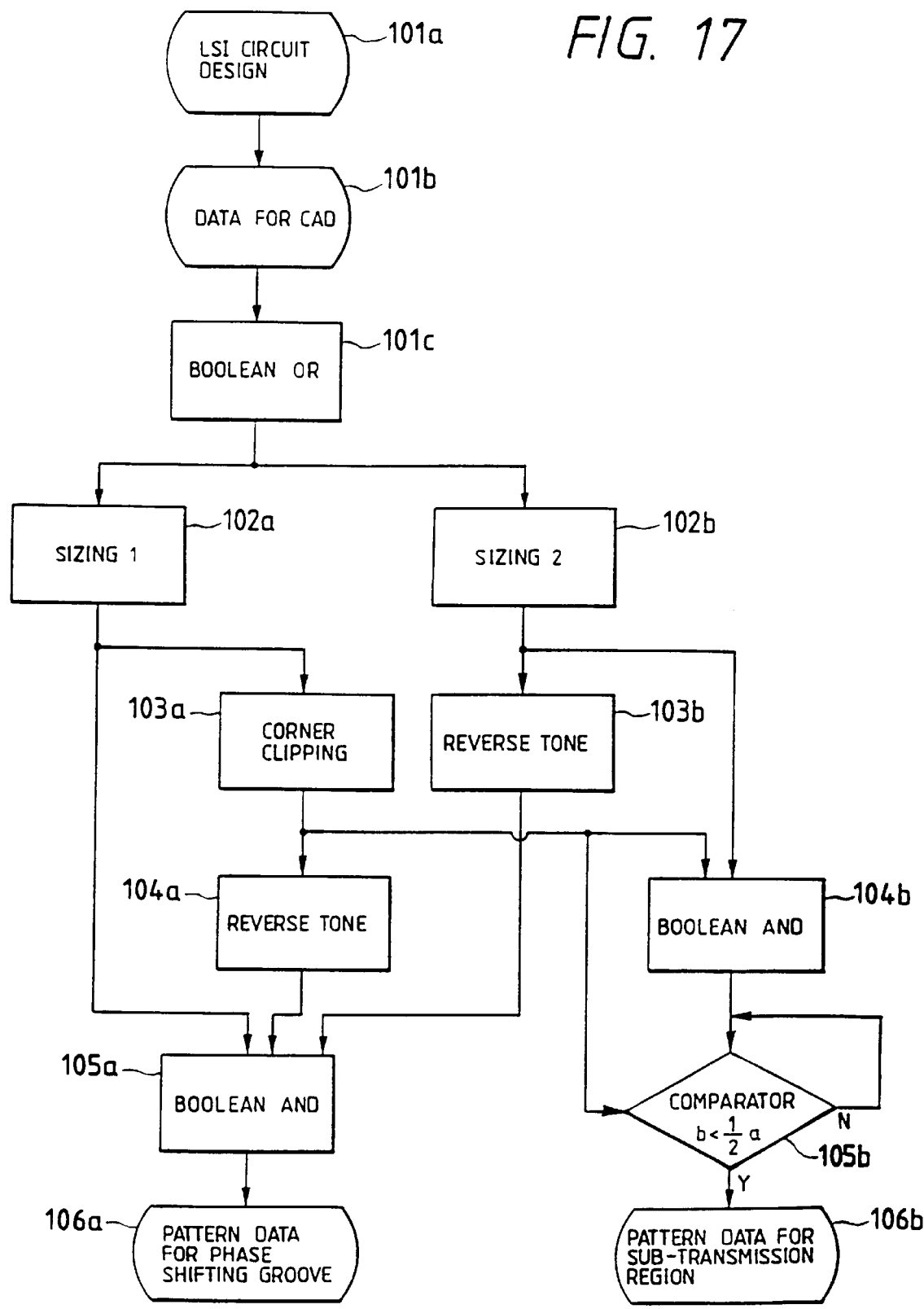
FIG. 17 is a flow chart representing the procedures through which the pattern data for the groove and sub-transmission region shown in FIG. 16 are prepared.
Figure 18C:
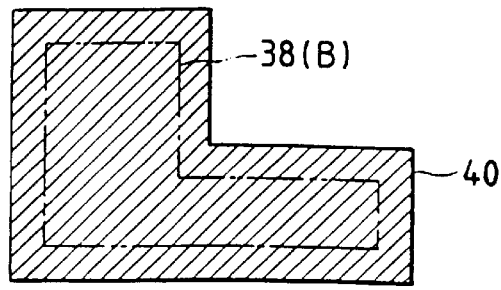
Figure 18D:
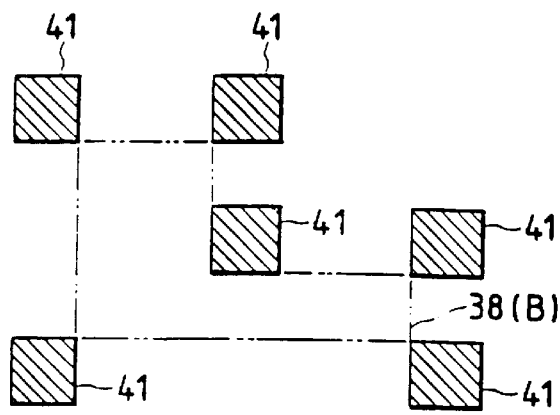
Figure 18E:
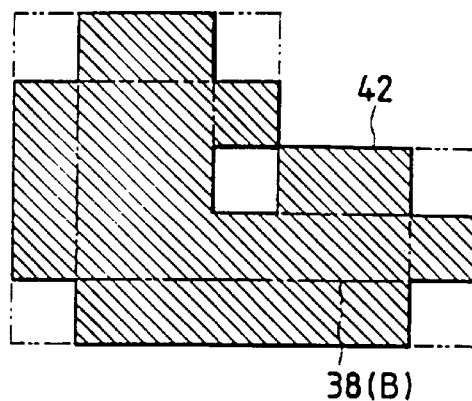
Figure 18F:
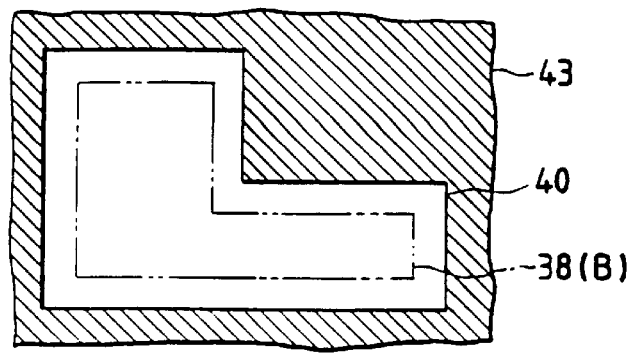
Figure 18G:
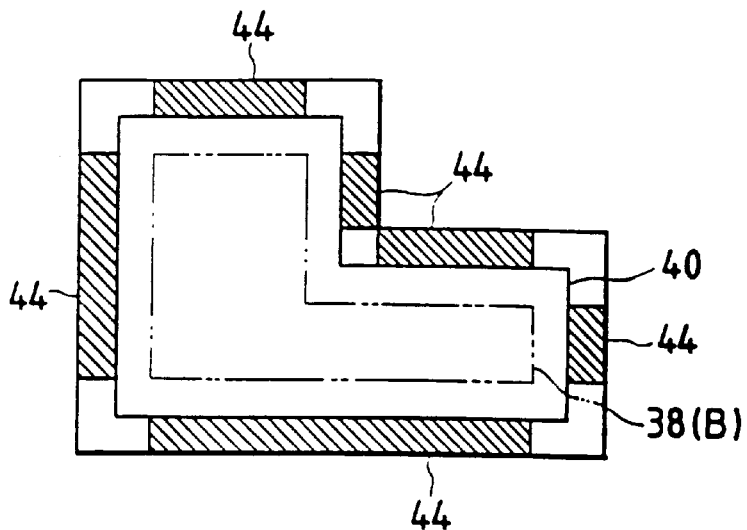
Figure 18H:
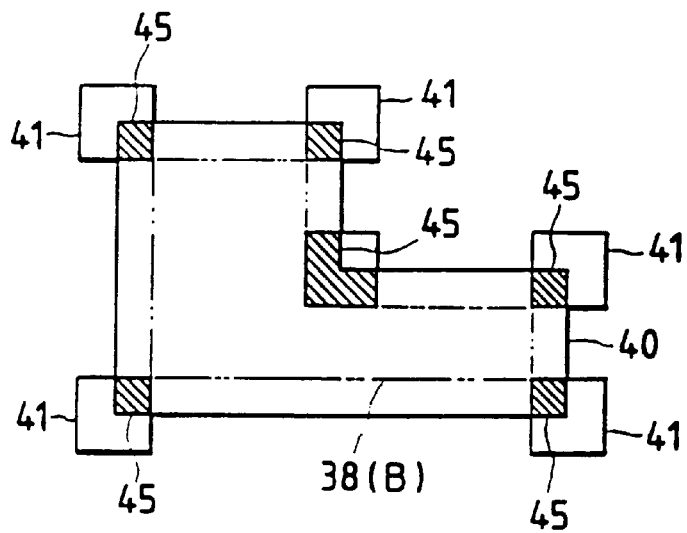
Figure 18I:
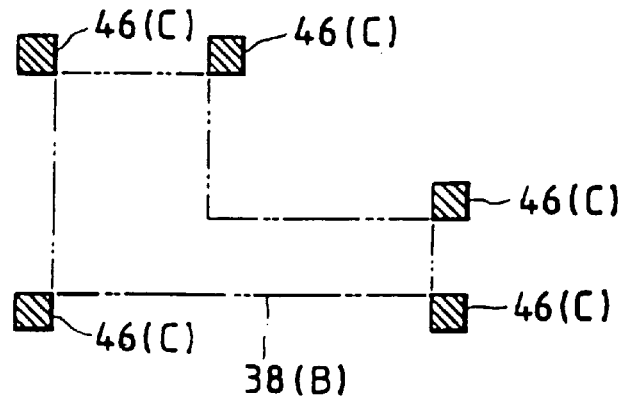
Figure 19A:
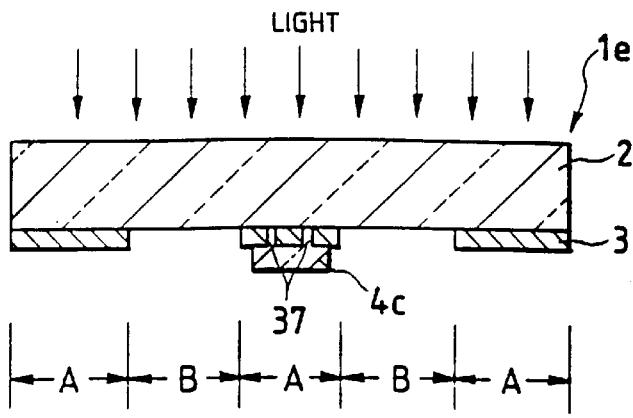
FIG. 19(a) is a sectional view of the mask shown in FIGS. 14 and 15 in a state of exposure.

FIG. 14 is a sectional view of the principal part of still another mask embodying the present invention, FIG. 15 is a top plan view of the principal part of the mask shown in FIG. 14, FIG. 16 is a top plan view of the principal part of a mask showing an example of pattern data for a groove and sub-transmission region, FIG. 17 is a flow chart representing the procedures through which the pattern data for the groove and sub-transmission region shown in FIG. 16 are prepared, FIGS. 18(a)–(i) are illustrations showing the shapes of the pattern in the course of forming the pattern for the groove and sub-transmission in FIG. 16, FIG. 19(a) is a sectional view of the mask shown in FIGS. 14 and 15 in a state of exposure, FIGS. and 19(b)–(d) are diagrams representing the amplitude and intensity of the light being transmitted through the transmission region of the mask shown in FIGS. 14 and 15.

The mask 1e of Embodiment 5 will subsequently be described with reference to FIGS. 14 and 15.

In mask 1e of Embodiment 5, a plurality of grooves 37 which extend respectively from the top surface of metal layer 3 to the main surface of substrate 2 are arranged on the metal layer comprising light shield region A.

Groove 37 is, as shown in FIG. 15, is arranged in parallel along each side of transmission region B in such manner that it surrounds each of rectangular transmission regions B, B. The width of groove 37 is, for example, approximately 0.5 μm.

Above groove 37, there is provided transparent film 4c made of indium oxide ($I_nO_x$) or the like having, for example, a refractive index of 1.5.

With transparent film 4c, mask 1e is so constructed that it generates a phase contrast between the light transmitted through transparent film 4c and groove 37 and the one through transmission region B at the time of exposure.

Given the thickness of transparent film 4c measured from the main surface of substrate 2 is $X_2$, transparent film 4c is formed, as in the aforementioned Embodiment 1, to satisfy the relation of $X_2=\lambda/[2(n_1-1)]$. This relation is maintained in order to generate a phase contrast of 180° between the phase of light transmitted through transparent film 4c and groove 37 and the phase of one through transmission region B in the lights irradiated onto mask 1c at the time of exposure. For example, in case where the wavelength of light λ irradiated at the time of exposure is 0.365 μm (i line), the thickness $X_2$ of transparent film 4c measured from the main surface of substrate 2 can be approximately 0.37 μm.

Furthermore, in Embodiment 5, as shown in FIG. 15 rectangular sub-transmission region C of, for example, approximately 0.5×0.5 μm in dimension is arranged at each of four corners of rectangular transmission region B. This is provided in order to prevent the four corners of a pattern of an integrated circuit formed at the right angles on a mask 1e from being rounded after its development as the miniaturization of an integrated circuit transmission regions C are arranged respectively at each of the four corners in an integrated circuit pattern in order to increase the light intensity in the vicinity of the four corners, where the light intensity tends to be most weakened resulting in a greater distortion, so that a projected image can be compensated. Also, although not shown in the drawing, when, for example, groove 37 or transparent film 4c is formed, an alignment mark is provided on mask 1c to align their position and that of metal layer 3.

To manufacture such a mask as mask 1e, the subsequent procedures will be taken, for example.

First, on the main surface of substrate 2 which has been ground, metal layer 3 of, for example, approximately 500–3, 000 Å is formed by sputtering or others. Subsequently, this substrate is held on holder 15 of focused ion beam system 8 described in the aforementioned Embodiment 3.

Next, metal layer 3 on the main surface of substrate 2 is patterned by focused ion beam in accordance with the data of an integrated circuit pattern stored beforehand in the magnetic tape of MT deck 36.

Likewise, after this, groove 37 is formed on metal layer 3 by irradiating the focused ion beam onto metal layer 3 on the main surface of substrate 2 in accordance with the pattern data of groove 37 and sub-transmission region C stored beforehand in the magnetic tape of MT deck 36.

The pattern data of groove 37 and sub-transmission region C, as will be described later, can automatically be prepared by providing an arrangement rule against rectangular transmission region B.

Then, the pattern data of transparent film 4c is prepared in accordance with the pattern data of an integrated circuit pattern and those of groove 37 and sub-transmission region C. Based on this, transparent film 4c is formed on mask 1c in the same manner as in the aforementioned Embodiment 1.

Here, the method of preparing the pattern data of groove 37 and sub-transmission region C formed on an integrated circuit pattern shown in FIG. 16 as an example will be described along the flow chart shown in FIG. 17 with reference to FIGS. 18(a)–(i). To facilitate examining the drawings, however, transparent film 4c is not shown in FIG. 16. Also, crosshatchings in FIGS. 18(a)–(i) represent the patterns produced in each process respectively.

First, the data of pattern 38 in transmission region B as shown in FIG. 18(a) are prepared (steps 101a–101c) through the processes of LSI circuit design, CAD design, the Boolean OR.

Subsequently, as shown in FIG. 18(b), pattern 39 is defined (102a) by thickening the pattern width of transmission region B by, for example, approximately 2.0 µm through the process of sizing 1.

At the same time, through the process of sizing 2, pattern 40 is produced (102b) by thickening the pattern width of transmission region B by, for example, 1.0 µm as shown in FIG. 18(c).

Next, through the process of corner clipping, the data of pattern 41 having only the corners extracted from pattern 39 are prepared a shown in FIG. 18(d) 103a). Then, through the process of reversing tones, the data of pattern 41 thus prepared are reversed from positive to negative in order to prepare the data of pattern 42 as shown in FIG. 18(e) (104a).

Furthermore, on the other hand, through the process of reversing tones, pattern 40 produced in the above-mentioned process of sizing 2 is reversed from positive to negative, and the data of pattern 43 shown in FIG. 18(f) are prepared (103b).

Then, the data of pattern 44 for groove 37 as shown in FIG. 18(g) are prepared (105a and 106a) by executing AND of the data of patterns 39, 42, and 43 shown respectively in FIGS. 18(b), (e) and (f).

Meanwhile, the data of pattern 45 shown in FIG. 18(h) are prepared (104b) by executing AND of the data of pattern 40 shown in FIG. 18(c) and those of pattern 41 shown in FIG. 18(d).

Subsequently, the area b of pattern 45 thus produced is judged to see if it is smaller than ½ of the area a of pattern 41 (105b). Through this judgement, those patterns, the area b of which are smaller than ½ of the area a are selected, and the data of pattern 46 of sub-transmission region C shown in FIG. 18(i) are prepared (106b). The reason why the area of pattern 45 is compared with a given value is that sub-transmission C region should necessarily be added only to the corner section having ⌐ shape of pattern 38 in transmission region B.

Next, the function of Embodiment 5 will be described with reference to FIGS. 19(a)–(d).

Figure 19B:
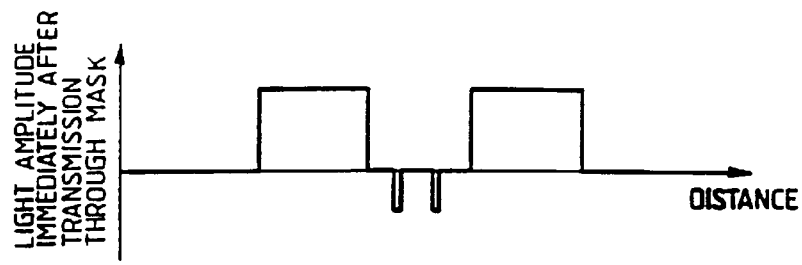
FIGS. 19(b)–(d) are diagrams representing the amplitude and intensity of the light being transmitted through the transmission region of the mask shown in FIGS. 14 and 15.
Figure 19C:
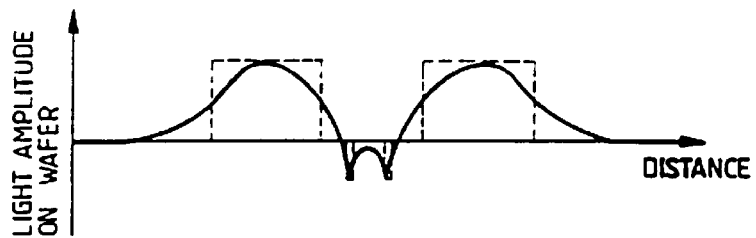

When the original of a given integrated circuit pattern on mask 1c shown in FIG. 19(a) is transferred onto a wafer by the method of demagnifying exposure or the like, a phase contrast of 180° is generated between the light transmitted through transparent film 4c and groove 37 and the one through transmission region B (FIGS. 19(b) and (c)) in each of transmission regions B in mask 1c.

Figure 19D:
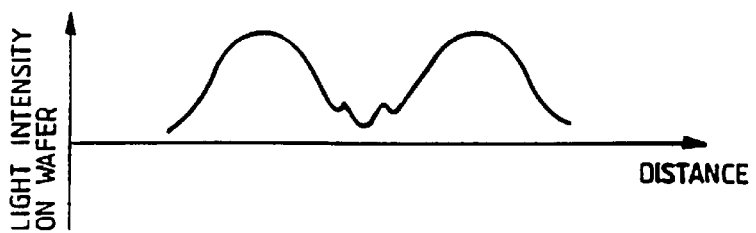

Here, the light transmitted through transparent film 4c and groove 37 and the one through transmission region B weaken each other at the end portion of light shield regions A, A adjacent to transmission region B. Therefore, the bleeding of contour of the image projected on a wafer can be reduced to improve the contrast of the projected image considerably, so that the resolution and depth of focus can be improved remarkably. Now, since the light intensity is the square of the light amplitude, the waveform in the negative side of light amplitude on a wafer is reversed to the positive side as shown in FIG. 19(d).

In this way, the following effects can be attained according to Embodiment 5:

(1). While lights are being irradiated onto mask 1e at the time of exposure, a phase contrast of 180° is generated between the light transmitted through transparent film 4c and groove 37 and the one through transmission region B. These lights are made to weaken themselves each other at the end portion of light shield region A, making it possible to reduce the bleeding of contour of the image projected on a wafer. As a result, the contrast of the projected image can be improved considerably so that the resolution and depth of focus can be improved remarkably.

(2). Through (1) mentioned above, more tolerance for exposure can be allowed.

(3). Through (1) mentioned above, the accuracy of pattern transfer can be improved.

(4). The accuracy of pattern transfer can be improved more by providing sub-transmission region C at each of four corners of transmission region B because its provision allows the light intensity of the projected image there to be further intensified.

(5). The time required for manufacturing a phase shifting mask can considerably be reduced as compared with the previous one by automatically producing the patterns of groove 37 and transparent film 4c.

[Embodiment 6]

Figure 20:
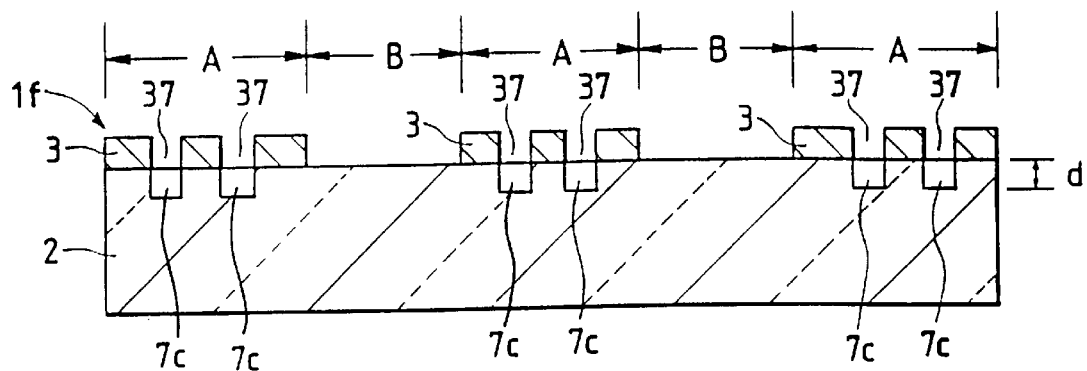
FIG. 20 is a sectional view of the principal part of still another mask embodying the present invention.
Figure 21:
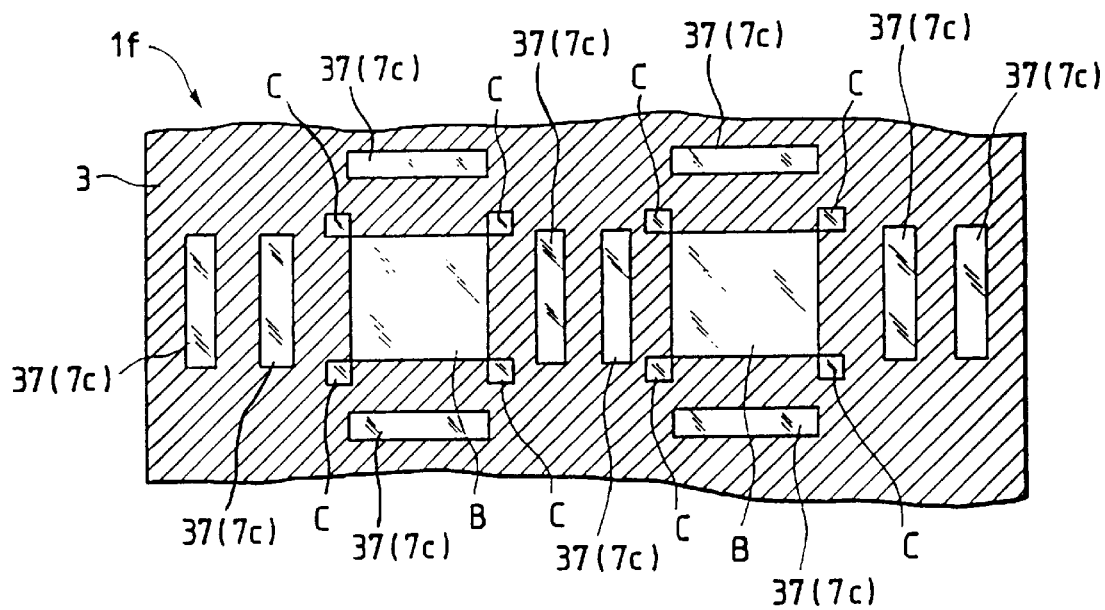
FIG. 21 is a top plan view of the principal part of the mask.
Figure 24A:
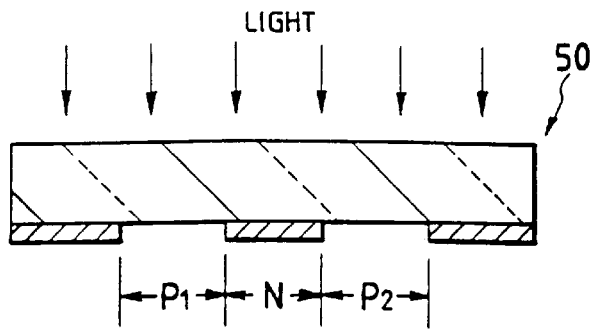
FIG. 24(a) is a sectional view of a conventional mask in a state of exposure.
Figure 24B:
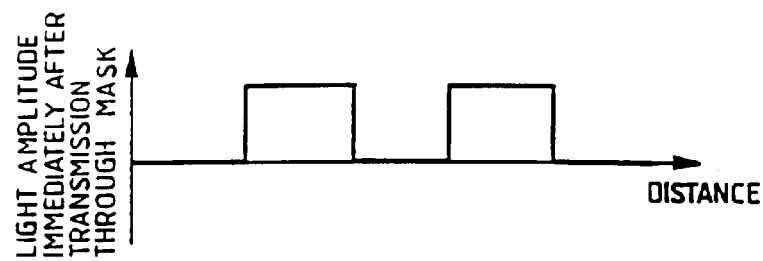
FIGS. 24(b)–(d) are diagrams representing the amplitude and intensity of the light being transmitted through the transmission region of the conventional mask.
Figure 24C:
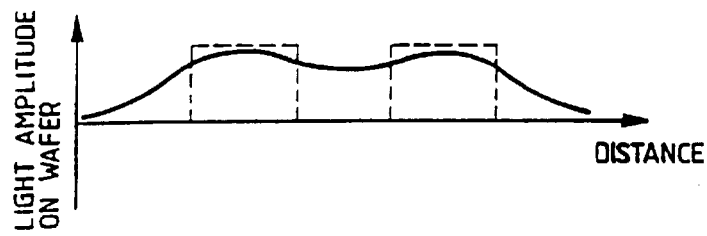
Figure 24D:
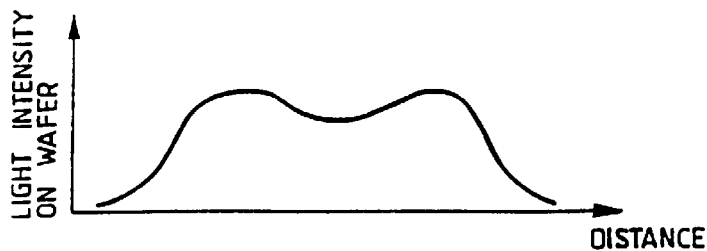
Figure 25A:
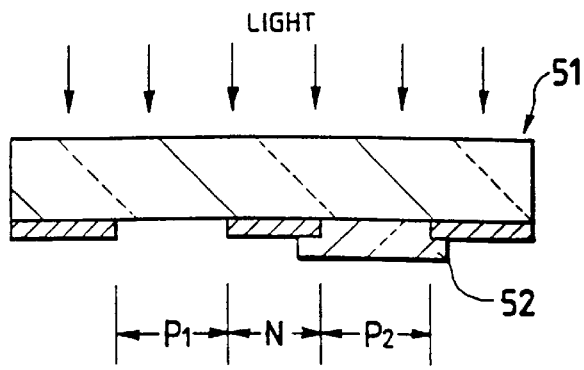
FIG. 25(a) is a sectional view of a conventional mask in a state of exposure.
Figure 25B:
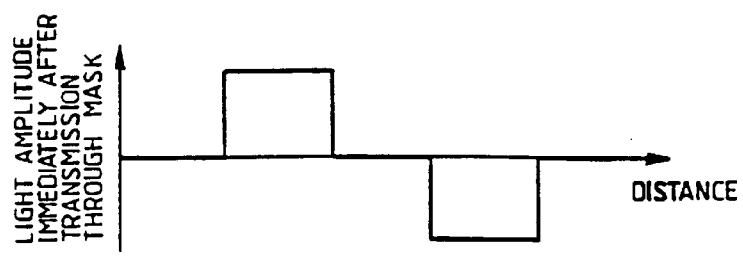
FIGS. 25(b)–(d) are diagrams representing the amplitude and intensity of the light being transmitted through the transmission region of the conventional mask.
Figure 25C:
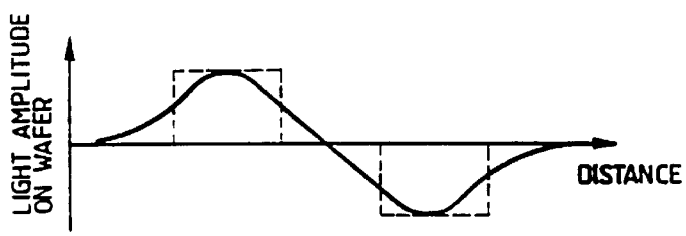
Figure 25D:
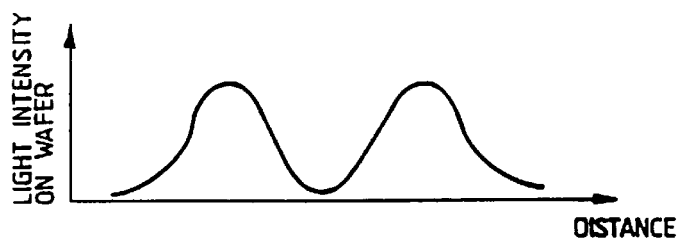
Figure 26:
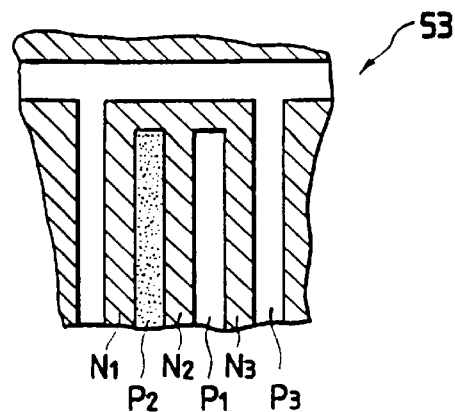
FIG. 26 is a partial top plan view illustrating a part of the convention mask.

FIG. 20 is a sectional view of the principal part of still another mask embodying the present invention, FIG. 21 is a top plan view of the principal part of the mask, FIG. 22(a) is a sectional view of the mask shown in FIGS. 20 and 21 in a state of exposure, and FIGS. 22(b)–(d) are diagrams representing the amplitude and intensity of the light being transmitted through the transmission region.

Mask 1f of Embodiment 6 will subsequently be described with reference to FIGS. 20 and 21.

In mask 1f of Embodiment 6, phase shifting groove 7c is formed on substrate 2 located below groove 37 instead of transparent film 4c of the aforementioned Embodiment 5 as means for generating a phase contrast between the light transmitted through groove 37 and the one through transmission region B.

Given the depth of phase shifting groove 7c is d, the refractive index of substrate 2 is $n_2$, and the wavelength of exposure light is $\lambda$, the phase shifting groove 7c is formed to maintain the relation of $d=\lambda/[2(n_2-1)]$ as in the aforementioned Embodiment 3.

For example, in case where the wavelength of light $\lambda$ is 0.365 µm (i line) the depth d of phase shifting groove 7b can be approximately 0.39 µm.

The bottom face of phase shifting groove 7c is almost flattened by a plasma dry etching treatment as in the aforementioned Embodiment 3 in order to improve the operativity of light transmitted through the end face thereof. Phase shifting groove 7c is produced by etching substrate 2 to the depth d by increasing the scanning numbers of focused ion beam when, for example, groove 37 is formed.

Also, in Embodiment 6 as in the aforementioned Embodiment 5, rectangular sub-transmission region C of, for example, approximately 0.5×0.5 μm is arranged at each of the four corners of rectangular transmission region B as shown FIG. 21. Furthermore, although not shown in the drawing, the alignment mark is provided on mask 1f in order to align its position with that of metal layer 3 when, for example, groove 37 or sub-transmission region C is formed.

The pattern data of groove 37 and sub-transmission region C are prepared in the same way as, for example, in the aforementioned Embodiment 5. Also, in this case, the pattern data of phase shifting groove 7c are identical to those of groove 37.

Next, the function of Embodiment 6 will be described with reference to FIGS. 22(a)–(d).

When the original of a given integrated circuit pattern on mask 1f shown in FIG. 22(a) is transferred onto a wafer by the method of demagnifying exposure light or the like, a phase contrast of 180° is generated between the light transmitted through groove 37 and phase shifting groove 7c and the one through transmission region B (FIGS. 13(b) and (c)).

Here, the light transmitted through groove 37 and phase shifting groove 7c and the one through transmission region B in the lights irradiated onto mask 1f weaken each other at the end portion of light shield regions A, A adjacent to transmission region B. As a result, the bleeding of contour of the image projected on a wafer can be reduced to improve the contrast of the projected image considerably so that the resolution and depth of focus can be improved remarkably (FIG. 22(d)). Also, since the light intensity is the square of the light amplitude, the waveform in the negative side of the light amplitude on a wafer is reversed to the positive side as shown in FIG. 22(d).

As set forth above, in Embodiment 6, the following effects can be attained in addition to the effects (1)–(5) of the aforementioned Embodiment 5:

(1). There is no need for the process of forming any transparent film for use in phase shifting, when mask 1f is manufactured, because phase shifting groove 7c is employed instead of transparent film 4c as means for shifting phase of light.

(2). In addition to (1) mentioned above, phase shifting groove 7c can be produced when groove 37 is formed on metal layer 3 by focused ion beam, whereby the process of manufacturing the phase shifting mask can be simplified as compared with mask 1e as in the aforementioned Embodiment 5, and the time required for its manufacture can be reduced remarkably.

(3). The manufacturing process of the phase shifting mask can be so simplified that external defect, adhesion of foreign materials, or any other causes of damage will be prevented remarkably as compared with mask 1e of the aforementioned Embodiment 5.

(4). In case of phase shifting groove 7c, there is no deterioration of, for example, the quality of film, the transmission rate, or adhesiveness to substrate 2 due to irradiation light or exposure light after the manufacture of the mask as in the case of a transparent film for use in phase shifting.

(5). Through (4) mentioned above, the life of the mask can be prolonged more than the one using a transparent film as the means for shifting phase of light.

(6). Through (4) mentioned above, the accuracy of light phase operation can be maintained longer than with the mask using a transparent film as the means for shifting phase of light.

(7). In case of phase shifting groove 7c, there is no need for such consideration as required for deterioration of the quality of film, transmission rate, or adhesiveness, and the removal of film or others as in the case of using a transparent film as the means for shifting the phase of light. Consequently, ozone sulfuric acid cleaning or high pressure water scrabble cleaning or other treatment can be conducted against mask 1f at a high-temperature.

(8). Through (7) mentioned above, the removal treatment of foreign materials can be conducted better than with the mask using the transparent film as the means for shifting phase of light.

[Embodiment 7]

FIG. 23 is a sectional view of the principal part of still another mask embodying the present invention.

In mask 1g of Embodiment 7 shown in FIG. 23, phase shifting groove 7d is produced at least on either one of a pair of transmission regions B, B having light shield region A therebetween.

The bottom face of phase shifting groove 7d is almost flattened by a plasma dry etching treatment as in the aforementioned Embodiment 3 in order to improve the operativity of phase of light transmitted through it.

Embodiment 7 is applicable to the portion where an integrated circuit pattern is simply arranged as in the case of, for example, a memory cell.

Phase shifting groove 7d is produced by etching substrate 2 to the depth d by increasing beam scanning numbers when, for example, transmission region B is formed as in the aforementioned Embodiment 6, by etching metal layer 3 with a focused ion beam.

As set forth above, the following effects can be attained according to Embodiment 7:

(1). At the time of exposure, the phase contrast of 180° is generated between the lights each transmitted through each of transmission regions B of the pair of transmission regions B, B having light shield region A therebetween so that the lights each transmitted through each of transmission regions B having shield region A therebetween can weaken each other in light shield region A. Consequently, the resolution of an image in light shield region located between the pair of transmission regions B can be improved, making it possible to improve the accuracy of pattern transfer.

(2). There is no need for the process of forming transparent film in the manufacture of mask 1g because of phase shifting groove 7d being employed as the means of shifting the phase of light instead of the conventional transparent film.

(3). In addition to (2) mentioned above, the manufacturing process of the phase shifting mask can be simplified as compared to manufacture of the conventional one, and its manufacturing time can also be reduced considerably by producing phase shifting groove 7d simultaneously with the patterning of metal layer 3 by focused ion beam.

(4). Since the manufacturing process of the phase shifting mask is simplified, external defect, adhesion of foreign materials or any other causes of damage can be prevented remarkably.

(5). In case of phase shifting groove 7d, there is no deteriorations of, for example, the quality of film, transmission rate, or adhesiveness by irradiation light or exposure light after the manufacture of the mask, as in the case of using a transparent film for conventional phase shifting.

(6). Through (5) mentioned above, the life of the mask having a means for shifting the phase of light can be prolonged more than the convention one.

(7). Through (5) mentioned above, the accuracy for light phase operation can be maintained longer than the conventional one.

(8). Since phase shifting groove 7d does not require any consideration for deteriorations of the quality of film, transmission rate or adhesiveness and the removal of film or others, ozone sulfuric acid cleaning or high pressure water scrabble cleaning or other cleaning treatment can be conducted against mask 1g at a high-temperature.

(9). Through (8) mentioned above, removal of foreign materials can be conducted better than with the mask using a transparent film.

As set forth above, the invention of the present inventor has been specifically described in accordance with embodiments. The present invention, however, is not limited to the aforementioned embodiments, and it is needless to say that modifications and variations are possible without departing from the spirit and scope of the present invention.

For example, in the aforementioned embodiment 3, there is described the case where the pattern data of the phase shifting groove is prepared by executing AND of the pattern data obtainable by magnifying the pattern of the light shield region and the pattern data of the transmission region. It is not limited to this case, and various modifications are possible. For example, it can be obtained by deducting the original pattern of the light shield region from the pattern formed by magnifying the pattern of the light shield region.

Also, in the aforementioned embodiments 1, 2, and 5, there is described the case where the transparent film employed is of indium oxide. The case is not limited to the application thereof. For example, silicon dioxide, silicon nitride, magnesium fluoride or polymethyl methacrylate or the like can be applied.

The descriptions set forth above have been made chiefly as to the application of the invention by the present inventor to the mask used in the process of manufacturing semiconductor integrated circuit devices, which is the industrial field defining the background of the invention. The present invention, however, is not limited to such an application only. It may be applicable to various technical fields where a transfer of a given pattern to a given substrate is required.

The typical effects obtainable by the invention disclosed in the present application will subsequently be described briefly.

According to the first invention, the light transmitted through the transparent film or phase shifting groove and the light transmitted through the portion where these are not provided interfere with each other at the boundary area of transmission and light shield regions so as to weaken themselves in each of transmission regions at the time of exposure. Thus, the bleeding of contour of an image projected on a wafer can be reduce so that the contrast of the projected image is improved considerably resulting in a remarkable improvement of the resolution and depth of focus. Especially, in this case, the phase contrast is generated within the lights being transmitted through one transmission region. Therefore, there is no restriction imposed upon the arrangement of transparent film no matter how complicated the pattern is on the mask. Also, the arrangement of transparent film can be made without difficulty no matter how narrow the pattern width is in the transmission region. As a result, the accuracy of pattern transfer will not be lowered locally, making it possible to improve remarkably the transfer accuracy of the entire pattern formed on the mask.

According to the second invention, the manufacturing time of the mask having a means for shifting the phase of light can be reduced considerably because there is no need for preparing specially any pattern data of transparent film or phase shifting groove.

According to the third invention, the light transmitted through the transmission region and the light transmitted through the groove and phase shifting groove interfere with each other to weaken themselves at the end portion of the transmission region so that the bleeding of contour of an image projected on a wafer can be reduced, and the contrast of the projected image will be improved considerably, making it possible to improve the resolution and depth of focus remarkably. As a result, the accuracy of pattern transfer can be improved.

According to the fourth invention, the light intensity at the corners of the transmission region is increased by arranging sub-transmission regions at the corners of the transmission region so that not only the resolution of the projected image at each side but also the resolution of the corners thereof can be improved.

I claim:

1. A method of making a phase shifting mask for reduction projection exposure wherein an integrated circuit pattern is optically reduced and transferred onto a wafer, which comprises:

(a) forming a first resist film over a major surface of a mask substrate having a light shielding film;

(b) exposing the first resist film by electron beam exposure, and thereby patterning the light shielding film so as to form a light shielding pattern for forming the integrated circuit pattern and forming an alignment mark;

(c) removing the first resist film;

(d) after step (c), forming a second resist film over the major surface of the mask substrate and the light shielding pattern;

(e) in accordance with the position of the alignment mark, aligning the position of a phase shifting pattern to be patterned; and then (f) exposing the second resist film by electron beam exposure, and thereby forming the phase shifting pattern constituting the integrated circuit pattern together with the light shielding pattern; and (g) removing the second resist film.

2. A method according to claim 1, wherein the phase shifting pattern includes at least one groove in the major surface of the mask substrate.

3. A method according to claim 1, wherein the phase shifting pattern is made of a transparent film over the major surface of the mask substrate.

4. A method according to claim 1, wherein the integrated circuit pattern is over the mask substrate.

5. A method according to claim 1, wherein the integrated circuit pattern is in the mask substrate.

6. A method of making a phase shifting mask for reduction projection exposure wherein an integrated circuit pattern is optically reduced and transferred onto a wafer, which comprises:

(a) forming a first resist film over a major surface of a mask substrate having a light shielding film;

(b) exposing the first resist film by energy beam exposure, and thereby patterning the light shielding film so as to form a light shielding pattern for forming the integrated circuit pattern and forming an alignment mark;

(c) removing the first resist film;

(d) after step (c), forming a second resist film over the major surface of the mask substrate and the light shielding pattern;

(e) in accordance with the position of the alignment mark, aligning the position of a phase shifting pattern to be patterned; then (f) exposing the second resist film by energy beam exposure, and thereby forming the phase shifting pattern constituting the integrated circuit pattern together with the light shielding pattern; and (g) removing the second resist film.

7. A method according to claim 6, wherein the phase shifting pattern includes at least one groove in the major surface of the mask surface.

8. A method according to claim 6, wherein the phase shifting pattern is made of a transparent film over the major surface of the mask substrate.

9. A method according to claim 6, wherein the integrated circuit pattern is over the mask substrate.

10. A method according to claim 6, wherein the integrated circuit pattern is in the mask substrate.

11. A method of making a phase shifting mask for reduction projection exposure wherein an integrated circuit pattern is optically reduced and transferred onto a wafer, which comprises:

(a) forming a first resist film over a major surface of a mask substrate having a light shielding film;

(b) exposing the first resist film by electron beam exposure, and thereby forming a first resist pattern;

(c) pattern the light shielding film using the first resist pattern as an etching mask, and thereby forming a light shielding pattern for forming the integrated circuit pattern and forming an alignment mark;

(d) removing the first resist pattern;

(e) after step (d), forming a second resist film over the major surface of the mask substrate and the light shielding pattern;

(f) in accordance with the position of the alignment mark, aligning the position of a phase shifting pattern to be patterned; then (g) exposing the second resist film by electron beam exposure, and thereby forming a second resist pattern;

(h) forming the phase shifting pattern constituting the integrated circuit pattern together with the light shielding pattern using the second resist pattern as an etching mask; and (i) removing the second resist film.

12. A method according to claim 11, wherein the phase shifting pattern includes at least one groove in the major surface of the mask substrate.

13. A method according to claim 11, wherein the phase shifting pattern is made of a transparent film over the major surface of the mask substrate.

14. A method according to claim 11, wherein the integrated circuit pattern is over the mask substrate.

15. A method according to claim 11, wherein the integrated circuit pattern is in the mask substrate.

* * * * *